United States Patent [19]

Koyanagi

[11] Patent Number: 5,021,842
[45] Date of Patent: Jun. 4, 1991

[54] TRENCH DRAM CELL WITH DIFFERENT INSULATOR THICKNESSES

[75] Inventor: Mitsumasa Koyanagi, Higashimurayama, Japan

[73] Assignee: Hitachi, Ltd., Tokyo, Japan

[21] Appl. No.: 253,183

[22] Filed: Oct. 4, 1988

Related U.S. Application Data

[63] Continuation of Ser. No. 13,558, Feb. 11, 1987, abandoned, which is a continuation of Ser. No. 600,904, Apr. 16, 1984, abandoned.

[30] Foreign Application Priority Data

Apr. 15, 1983 [JP] Japan .................................. 58-65432

[51] Int. Cl.$^5$ .......................................... H01L 27/108
[52] U.S. Cl. ...................................... 357/23.6; 357/55
[58] Field of Search ...................... 357/23.6, 55, 23.11

[56] References Cited

U.S. PATENT DOCUMENTS

| | | | |
|---|---|---|---|
| 3,892,608 | 7/1975 | Kuhn | 357/59 |
| 4,119,772 | 10/1978 | Natori | 357/23.6 |
| 4,139,442 | 2/1979 | Bondur et al. | 357/50 |
| 4,353,086 | 10/1982 | Jaccodine | 357/23.6 |
| 4,419,743 | 12/1983 | Taguchi et al. | 357/23.6 |
| 4,432,006 | 2/1984 | Takei | 357/23.6 |
| 4,475,118 | 10/1984 | Klein et al. | 357/23.6 |

FOREIGN PATENT DOCUMENTS

| | | |
|---|---|---|
| 44400 | 1/1982 | European Pat. Off. . |
| 85988 | 8/1983 | European Pat. Off. . |
| 88451 | 9/1983 | European Pat. Off. . |
| 2148948 | 4/1973 | Fed. Rep. of Germany . |
| 2728928 | 1/1979 | Fed. Rep. of Germany . |
| 3137708 | 4/1983 | Fed. Rep. of Germany . |
| 51-130178 | 11/1976 | Japan . |
| 56-43753 | 4/1981 | Japan .................. 357/23.6 |
| 58-3260 | 1/1983 | Japan . |
| 81-3241 | 11/1981 | PCT Int'l Appl. . |

OTHER PUBLICATIONS

Sunami et al., IEEE International Electron Dev. Meeting; Tech. Digest, pp. 806–808, Dec. 12, 1982.
IBM TDB, Dec. 1980, pp. 2863–2865.
IBM TDB, Jul. 1982, pp. 593–596.
Electronics, Dec. 15, 1982, pp. 86 and 88 (Sunami).

*Primary Examiner*—William D. Larkins
*Attorney, Agent, or Firm*—Antonelli, Terry, Stout & Kraus

[57] ABSTRACT

A DRAM having the capacitors of memory cells formed by utilizing moats is disclosed. The moats are provided in a semiconductor substrate independently for the respective capacitors by anistropic dry etching, and they serve to increase the capacitances of the capacitors without increasing the areas which they occupy. The greater part of each capacitor is buried in the moat. The capacitors are electrically isolated from the semiconductor substrate, and the semiconductor substrate is not used as the electrodes of the capacitors. The capacitor consists of first and second polycrystalline silicon layers, and an insulator film formed therebetween. The first polycrystalline silicon layer serves as a lower electrode electrically isolated from the semiconductor substrate. This first polycrystalline silicon layer is formed independently for each capacitor, and it is connected to the source or drain region of the MISFET of the memory cell. The second polycrystalline silicon layer and the insulator film are common to the memory cells in an identical memory cell array, and are unitarily formed. A fixed potential is applied to the second polycrystalline silicon layer.

16 Claims, 18 Drawing Sheets

TRENCH DRAM CELL WITH DIFFERENT INSULATOR THICKNESSES

This is a continuation of U.S. application Ser. No. 013,558, filed Feb. 11, 1987 which is a continuation of U.S. application Ser. No. 600,904, filed Apr. 16, 1984, now abandoned.

The present invention relates to a dynamic random access memory (DRAM).

The DRAM employs as a memory cell a series circuit which consists of a storage capacitor and a switching transistor (MISFET). For purposes of increasing the quantity of information (the number of bits) and enhancing the access time, it is desirable to provide a higher density of integration for the DRAM. For raising the integration density of the DRAM, it is the most effective to reduce the area occupied by the storage capacitor. The reduction of the area, however, brings about a decrease in the capacitance of the capacitor. Unfavorably, this leads to an increase in soft errors ascribable to alpha particles ($\alpha$ particles), and to the shortening of a refresh cycle.

Several ideas have been proposed for reducing the area occupied by the storage capacitor without lowering the capacitance. As one of these ideas, a DRAM including new storage capacitors (termed "trench capacitors" or "corrugated capacitors") whose capacitances are formed, not only on the surface of a semiconductor substrate, but also inwardly of the semiconductor substrate, has been proposed in Japanese Patent Kokai 51-130178. The new storage capacitors are formed as follows. Each moat (also termed "U-groove" or "trench") is formed in one major surface of a semiconductor substrate. An insulator film is formed on the exposed surface of the semiconductor substrate within the moat. Further, a capacitor electrode covering the insulator film is formed. The MIS type capacitor is constructed of the semiconductor substrate, the insulator film and the capacitor electrode within the moat.

SUMMARY OF THE INVENTION

The inventor manufactured the above-stated DRAM by way of trial and studied it. As a result, problems to be described below have been found as to further promoting the enhancement of the integration density of the DRAM.

The first problem is the spread of a depletion layer. In the storage capacitor described above, a part which stores charges serving as information is the moat portion within the semiconductor substrate. In a case where the distance between the respectively adjacent storage capacitors is made still shorter in order to enhance the density of integration, respective depletion layers which stretch from the side walls of the moats forming the adjacent storage capacitors couple with each other. When a potential difference exists between the adjacent storage capacitors, the charges migrate from the capacitor of higher potential to the capacitor of lower potential That is, the charges leak between the adjacent capacitors. This leads to the inversion of the information, and in turn, to a lowering of the reliability of the memory. The problem has hampered the enhancement of the integration density of the DRAM.

The second problem is an increase in the influence of $\alpha 0$ particles. As compared with a conventional storage capacitor which is planar, the three-dimensional capacitor structure based on the moat can store a larger amount of charges within the semiconductor substrate. At the same time, however, the structure is more influenced by minority carriers which develop due to $\alpha 0$ particles within the semiconductor substrate. That is, as the moat extending inwards from one major surface of the semiconductor substrate becomes deeper, the degree of influence by the minority carriers increases more conspicuously. It is difficult to attain a large enough amount of charges to neglect the influence of the minority carriers created by the $\alpha 0$ particles. The reason is that increasing the depth of the moat is limited. The problem has hampered the enhancement of the reliability of the DRAM.

The third problem is the difficulty of flattening. The widthwise dimension of the moat immediately after having been formed in the semiconductor substrate is at least approximately 1 $\mu$m with the present-day technical level of a practical product. Since thickening the capacitor electrode forms a cause for the breaking of a word line, the moat cannot be entirely filled with the material of the capacitor electrode and that of the insulator film. In consequence, a depression arises in the upper part of the moat. Thus, the word lines and bit lines which are formed over the moats are liable to break. The depression also leads to working dispersions in the wiring width, the wiring length, etc. thereof. These have formed causes for the dispersions of the electrical characteristics of the DRAM articles and the occurrence of non-conforming articles.

An object of the present invention is to provide a DRAM formed with storage capacitors in moats, which is suited to enhancement in the density of integration.

Another object of the present invention is to prevent the charge leakage phenomenon between adjacent storage capacitors in a DRAM which is formed with the storage capacitors in moats.

Another object of the present invention is to reduce the influence of minority carriers created by $\alpha 0$ particles, upon storage capacitors in a DRAM which is formed with the storage capacitors in moats.

Another object of the present invention is to prevent the leakage current between a storage capacitor and a substrate, thereby prolonging the information retention time.

Still another object of the present invention is to prevent depressions over moats to form storage capacitors therein, in a DRAM which is formed with the storage capacitors in the moats.

The aforementioned and other objects of the present invention and the novel features thereof will become more apparent from the following description of the specification taken in conjunction with the accompanying drawings.

A typical aspect of the present invention disclosed herein will be briefly summaried below.

The storage capacitor of each memory cell is formed in a moat which is electrically isolated from a semiconductor substrate. The storage capacitor is composed of first and second polycrystalline silicon layers, and an insulator film interposed therebetween. Both the first and second polycrystalline silicon layers are buried in the moat. The first polycrystalline silicon layer which is the lower layer is electrically isolated from the semiconductor substrate by a insulator film. The first polycrystalline silicon layer is connected to the MISFET of the memory cell. Thus, depletion layers to extend from the capacitors of the adjacent memory cells into the semiconductor substrate are avoided to achieve a higher density of integration.

DESCRIPTION OF THE PREFERRED EMBODIMENTS

Figure 1:
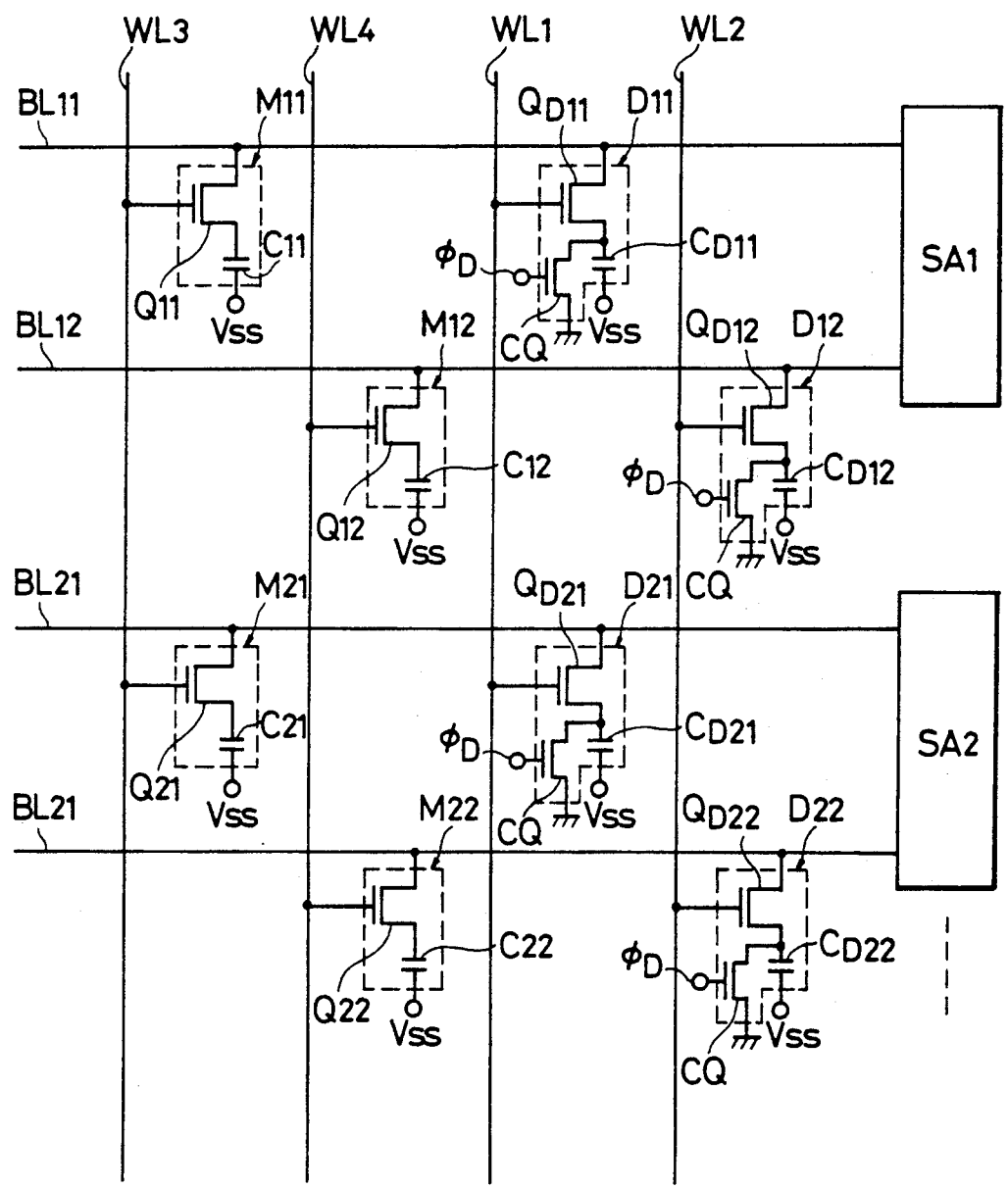
FIG. 1 is an equivalent circuit diagram illustrative of the essential portIons of a DRAM for explaining a first embodiment of the present invention.

FIG. 1 is an equivalent circuit diagram illustrative of the essential portions of a DRAM for explaining a first embodiment of the present invention.

$SA_1$, $SA_2$, ... indicate sense amplifiers, each of which serves to amplify the minute potential difference between a predetermined memory cell and a predetermined dummy cell. $BL_{11}$ and $BL_{12}$ indicate bit lines which extend in an identical direction from the sense amplifier $SA_1$. $BL_{21}$ and $BL_{22}$ indicate bit lines which extend in an identical direction from the sense amplifier $SA_2$. These bit lines BL serve to transmit information. $WL_1$ and $WL_2$ designate word lines which extend in a direction intersecting the bit lines $WL_3$ and $WL_4$ designate word lines which extend in the same direction as that of the word lines $WL_1$ and $WL_2$.

$M_{11}$, $M_{12}$, $M_{21}$, $M_{22}$, ... denote memory cells, which hold charges serving as the information. The respective memory cells $M_{11}$, $M_{12}$, $M_{21}$, $M_{22}$ ... consist of MISFETs $Q_{11}$, $Q_{12}$, $Q_{21}$, $Q_{22}$ ... and capacitors $C_{11}$, $C_{12}$, $C_{21}$, $C_{22}$.... Each of the MISFETs $Q_{11}$, $Q_{12}$, $Q_{21}$, $Q_{22}$ ... has one end connected to the predetermined bit line BL, and has a gate electrode connected to the predetermined word line WL. Each of the capacitors $C_{11}$, $C_{12}$, $C_{21}$, $C_{22}$ ... has one end connected to the other end of the corresponding one of the MISFETs $Q_{11}$, $Q_{12}$, $Q_{21}$, $Q_{22}$ ..., and has the other end connected to a fixed potential $V_{SS}$ (zero V) terminal.

$D_{11}$, $D_{12}$, $D_{21}$, $D_{22}$, ... denote dummy cells for holding charges with which whether the information of the memory cells is "1" or "0" can be judged. The respective dummy cells $D_{11}$, $D_{12}$, $D_{21}$, $D_{22}$ ... are composed of MISFETs $Q_{D11}$, $Q_{D12}$, $Q_{D21}$, $Q_{D22}$ ..., capacitors $C_{D11}$, $C_{D12}$, $C_{D21}$, $C_{D22}$ ... and MISFETs CQ. EAch of the MISFETs $Q_{D11}$, $Q_{D12}$, $Q_{D21}$, $Q_{D22}$ ... has one end connected to the predetermined bit line BL, and has a gate electrode connected to the predetermined word line WL. Each of the capacitors $C_{D11}$, $C_{D12}$, $C_{D21}$, $C_{D22}$ ... has one end connected to the other end of the corresponding one of the MISFETs $Q_{D11}$, $Q_{D12}$, $Q_{D21}$, $Q_{D22}$ ...; and has the other end connected to the fixed potential $V_{SS}$ terminal. The MISFETs CQ are disposed for discharging (clearing) the charges stored in the capacitors $C_{D11}$, $C_{D12}$, $C_{D21}$, $C_{D22}$ ..., $\phi_D$ indicates a terminal for applying a discharge signal to the gate electrode of the MISFET CQ.

Now, the structure of the first embodiment of the present invention will be described.

Figure 2A:
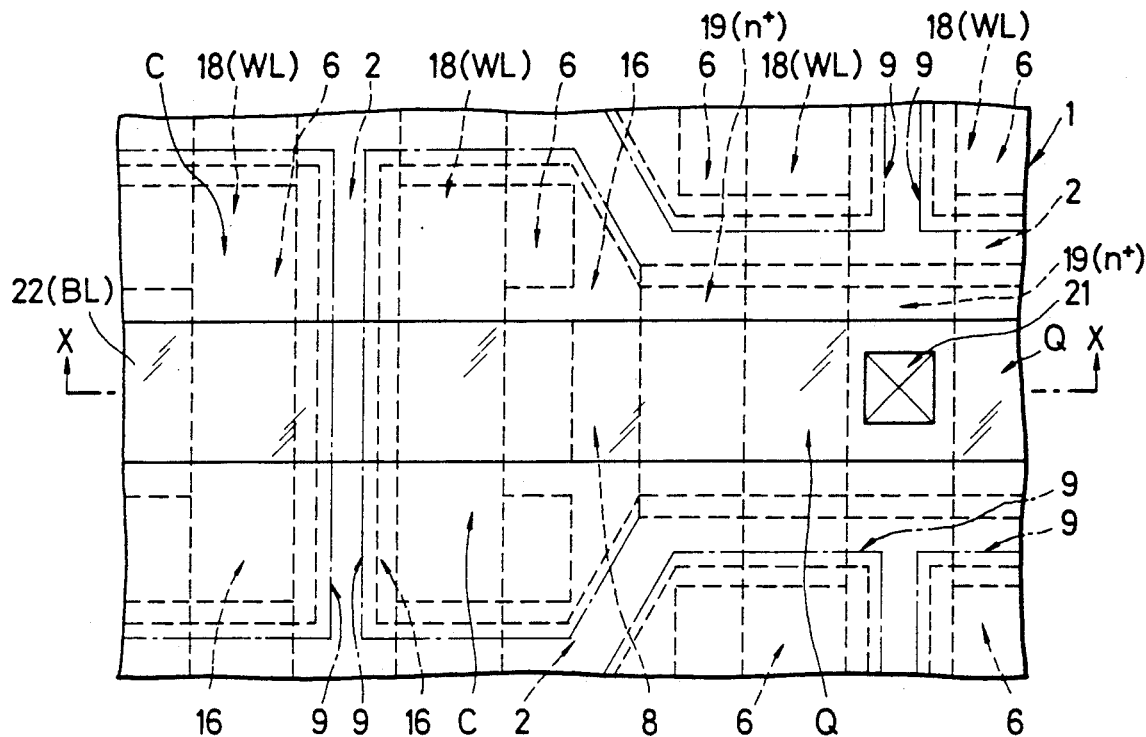
FIG. 2A is a plan view illustrative of the essential portions of a memory cell for explaining the DRAM of the first embodiment of the present invention.
Figure 2B:
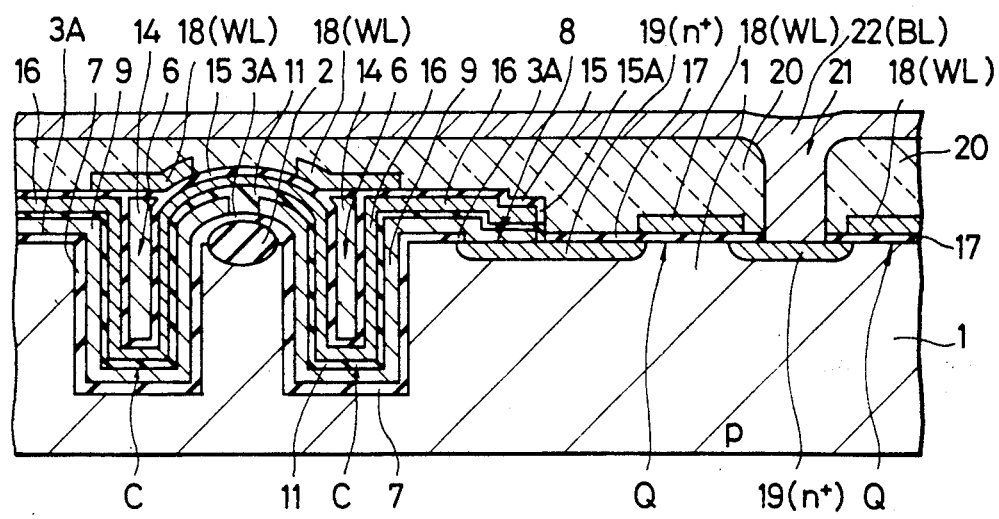
FIG. 2B is a sectional view taken along line X—X in FIG. 2A.
Figure 3:
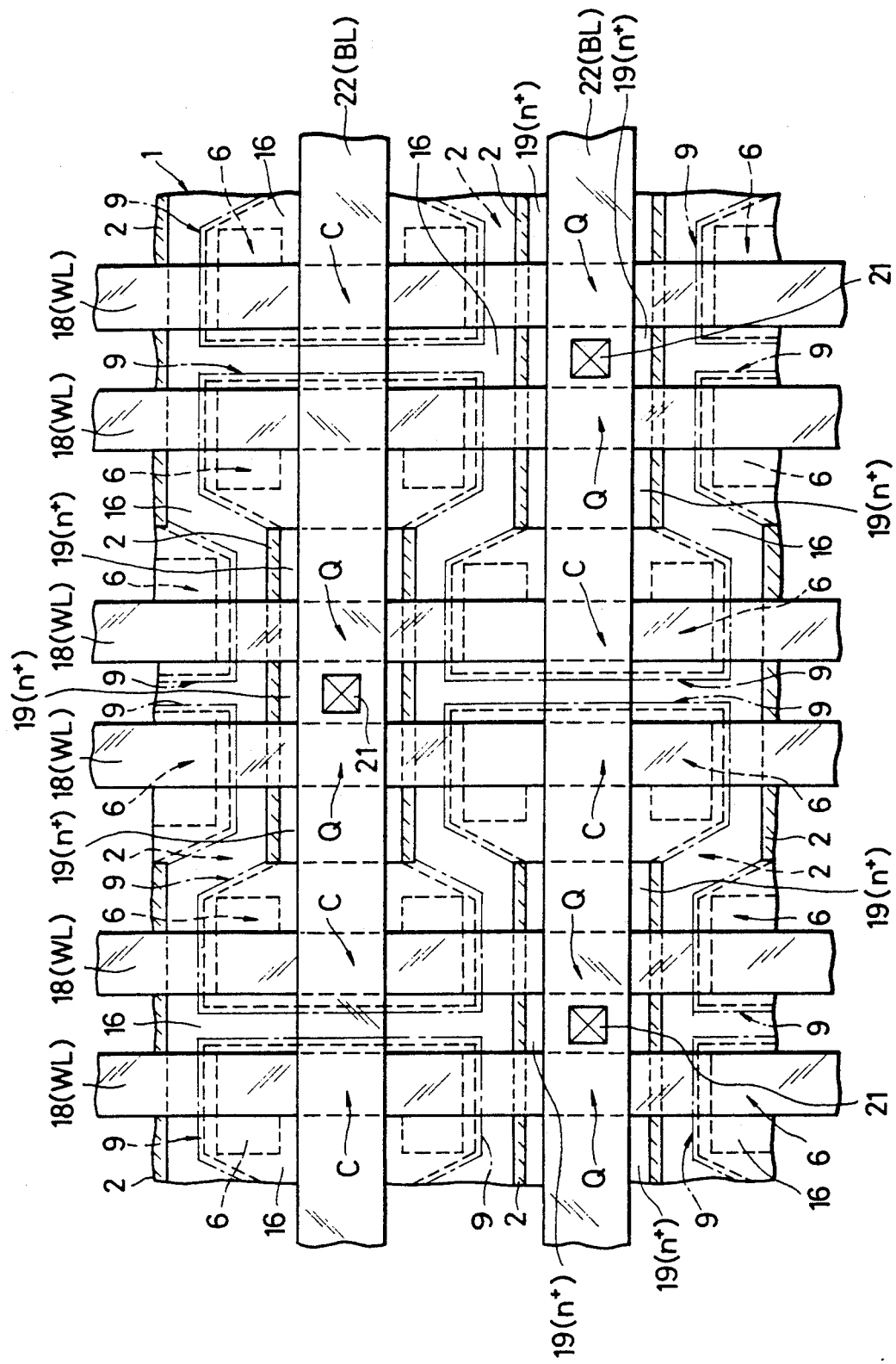
FIG. 3 is a plan view showing the essential portions of a memory array which is constructed of the memory cells as shown in FIGS. 2A and 2B.

FIG. 2A is a plan view illustrative of the essential portions of a memory cell for explaining the DRAM of the first embodiment of the present invention, while FIG. 2B is a sectional view taken along line X—X in FIG. 2A. FIG. 3 is a plan view illustrative of the essential portions of a memory cell array which is constructed of the memory cells as shown in FIGS. 2A and 2B. In FIG. 3, in order to clarify the drawing, insulator films to be formed between conductive layers are not shown.

Throughout the figures concerning the first embodiment, portions having the same functions are assigned the same symbols, and they shall not be repeatedly explained.

Numeral 1 designates a p-type semiconductor substrate which is made of single-crystal silicon (Si).

Numeral 2 designates a field insulator film which is formed between the adjacent memory cells in one major surface of the semiconductor substrate 1, and which serves to electrically isolate them. The field insulator film 2 integrally surrounds two memory cells which are connected to a bit line 22 through an identical contact hole 21. The memory cell array is such that the memory cells are arranged in the shape of a matrix as shown in FIG. 3, with repeated fundamental units each of which consists of the two memory cells integrally surrounded with the field insulator film. The MISFETs Q of the two memory cells share an $n^+$-type semiconductor region 19 which is connected to the bit line 22.

The capacitor C of the memory cell is composed of a first electrode (hereinbelow, termed "first capacitor plate") 9 indicated by a dot-and-dash line, a second electrode (hereinbelow, termed "second capacitor plate") 16, and an insulator film 11 interposed therebetween. The first and second capacitor plates 9 and 16 are made of a conductor.

The first capacitor plate 9 is connected to the MISFET Q of the memory cell. The second capacitor plate 16 has the fixed potential $V_{SS}$ applied thereto. The capacitor C is essentially formed so as to be buried in a moat (U-groove) 6 which, in turn, is formed in a manner to extend from a predetermined part of the major surface of the semiconductor substrate 1 thereinto. To the end of increasing the capacitance of the capacitor C, the moat 6 is not made an oblong, but it is made a shape clearly shown in FIG. 2A. Numeral 7 indicates an insulator film which is formed inside the moat 6, namely, on the surfaces of the semiconductor substrate 1 corresponding to the side surface and bottom surface of the moat 6, and which serves to electrically isolate the semiconductor substrate 1 and the first capacitor plate 9. The insulator film 7 is thicker than an insulator film 3A. Whatever voltage is applied to the first capacitor plate 9, no information is stored in the peripheral part of the moat 6 within the semiconductor substrate 1. When the potential of the first capacitor plate 9 is zero V, the capacitance between the semiconductor substrate 1 and the first capacitor plate 9 is very low. When the potential of the first capacitor plate 9 is 5 V, merely a depletion layer spreads in the surface of the semiconductor substrate 1, and charges to form an inversion layer are not supplied from the semiconductor region 19.

Numeral 8 denotes a contact hole which is provided by removing a predetermined part of the insulator film 3A in order to connect the first capacitor plate 9 and one semiconductor region 19 constituting the MISFET. The first capacitor plate 9 is formed on the insulator film 7, the insulator film 3A and the semiconductor region 19. The contact holes 8 are omitted from FIG. 3 for drawing simplification. For example, zero V or 5 V is applied to the first capacitor plate 9 in correspondence with the information. The respective first capacitor plates 9 of the adjacent memory cells are structurally and electrically isolated. As shown by dot-and-dash lines in FIG. 3, the first capacitor plates 9 are independently disposed for the respective memory cells. The insulator film 11 and the second capacitor plate 16 of the memory cells are common to the memory cells in the identical memory cell array, and are integrally formed. As seen from FIG. 3, the insulator film 11 and the second capacitor plate 16 are not formed in the selected regions in which the MISFETs Q of the memory cells are provided. The charges which serve as the information are stored in that part of the insulator film 11 which is sandwiched between the first capacitor plate 9 and the second capacitor plate 16. Numeral 14 denotes a filling material buried in the moat 6. It serves to alleviate a depression which will appear over the moat 6 in a case where this moat 6 is not filled up with a conductive material and an insulator material.

The second capacitor plate 16 and the filling material 14 are electrically isolated from a gate electrode and word line 18(WL) by insulator films 15 and 15A.

The MISFET Q comprises a gate insulator film 17, the gate electrode 18, and the n+-type semiconductor regions 19 each of which is a source or drain region. The gate insulator film 17 is provided on that part of the major surface of the semiconductor substrate 1 in which the MISFETs are formed. The gate electrode 18 is unitary with the word line WL for applying a voltage to the gate electrode 18. The semiconductor regions 19 are provided on both the sides of the gate electrode 18 in the surface of the semiconductor substrate 1 corresponding to the MISFET forming part. The semiconductor region 19 is defined by the gate electrode 18, the field insulator film 2 and the first capacitor plate 9. The word line WL extends over the moat 6 whose surface is flattened.

Numeral 20 indicates an insulator film which is formed between the gate electrode 18 or word line WL and the bit line 22, and which electrically isolates them. The contact hole 21 serves to connect the semiconductor region 19 and the bit line 22. The bit line 22 is disposed so as to extend on the insulator film 20 and to connect with the semiconductor regions 19 through the contact holes 21 in predetermined parts.

The operation of the first embodiment will now be described with reference to FIGS. 2A and 2B, by exemplifying the memory cell which consists of the MISFET Q and the capacitor C.

A case of writing information into the memory cell will be explained. When a control voltage is applied to the gate electrode constituting the MISFET Q of the memory cell, this MISFET Q is turned ON. A voltage corresponding to the information is applied to the bit line (BL) 22 which is connected to the semiconductor region 19 of the MISFET Q remote from the capacitor C with respect to the gate electrode. Thus, the voltage of the bit line (BL) 22 corresponding to the information is applied to the first capacitor plate 9 through the MISFET Q. When a potential difference exists between the first capacitor plate 9 and the second capacitor plate 16 held at the fixed potential $V_{SS}$, charges to serve as the information are stored or written in the capacitor C. Thereafter, in order to retain the information in the memory cell, the MISFET Q is turned OFF.

In case of reading out the information of the memory cell, the reverse operation to the above writing operation may be performed.

According to the first embodiment, the capacitor of the memory cell can be formed within the moat which is electrically isolated from the semiconductor substrate, with the result that the leakage phenomenon between this capacitor and the capacitor of the adjacent memory cell can be prevented.

In order to electrically isolate the adjacent memory cells more, a channel stopper region of, e.g., the p+-type may well be formed in the part of the semiconductor substrate 1 under the field insulator film 2.

FIGS. 4A, 5A, 6A, 7A, 10A, 11A and 12A are plan views illustrative of the essential portions of the memory cell at various manufacturing steps for explaining a method of producing the DRAM of the first embodiment. FIGS. 4B, 5B, 6B, 7B, 8, 9, 10B, 11B and 12B are sectional views illustrative of the essential portions of the memory cell at various manufacturing steps for explaining the method of producing the DRAM of the first embodiment. The respective figures labelled B are sectional views taken along lines X—X in the corresponding figures labelled A.

Figure 4A:
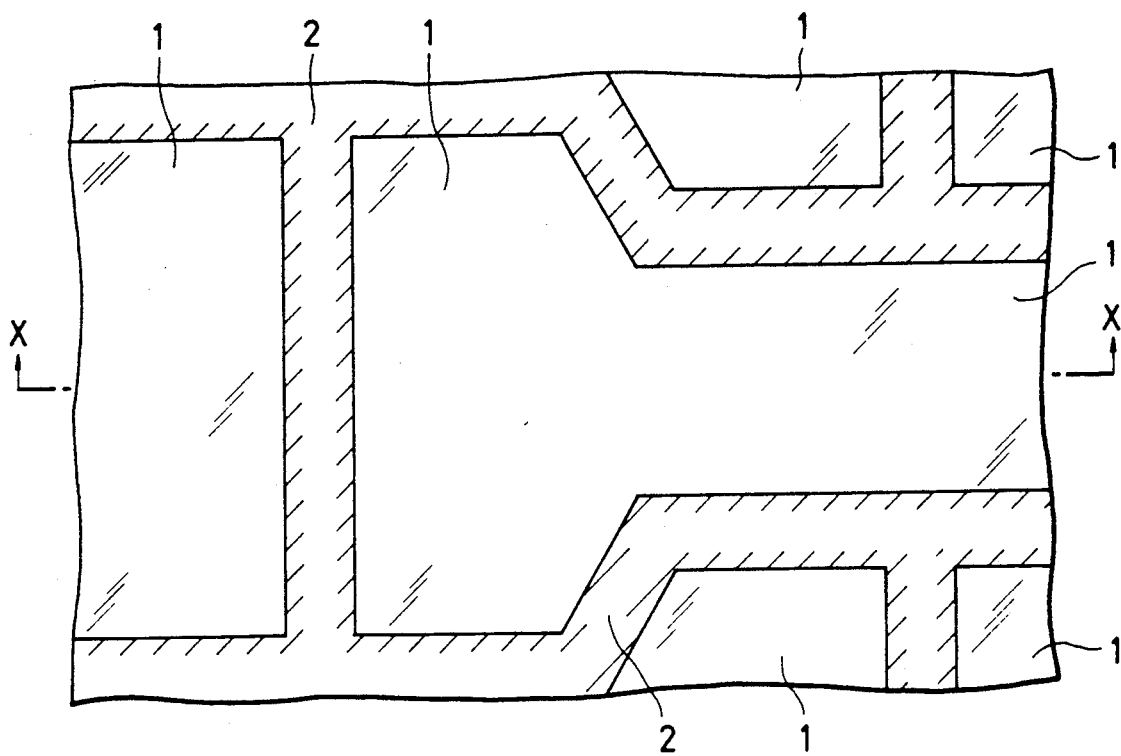
FIGS. 4A to 12B are views for explaining a method of manufacturing the DRAM shown in FIGS. 2A and 2B.
Figure 4B:
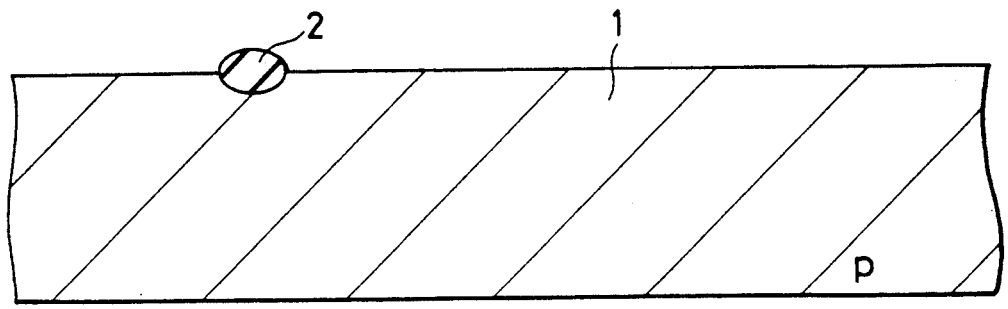

A p-type semiconductor substrate 1 made of single-crystal silicon (Si) is prepared. As shown in FIGS. 4A and 4B, the semiconductor substrate 1 is covered selectively with a field insulator film (SiO₂ film) 2 being 0.6-1 μm thick in order to electrically isolate adjacent memory cells and the semiconductor elements (not shown) of peripheral circuits, for example, an addressing circuit, a reading circuit and a writing circuit. The field insulator film 2 is formed by a conventional selective thermal oxidation technique for the surface of the semiconductor substrate 1 employing a silicon nitride film as an oxidation impermeable mask.

Although not shown, a p+-type channel stopper region should desirably be formed on the surface of the semiconductor substrate 1 under the field insulator film 2. In this regard, before the field insulator film 2 is formed, a p-type impurity such as boron is ion-implanted into the semiconductor substrate 1 by the use of the oxidation impermeable mask. During the thermal oxidation, the boron is diffused to form the channel stopper region.

Figure 5A:
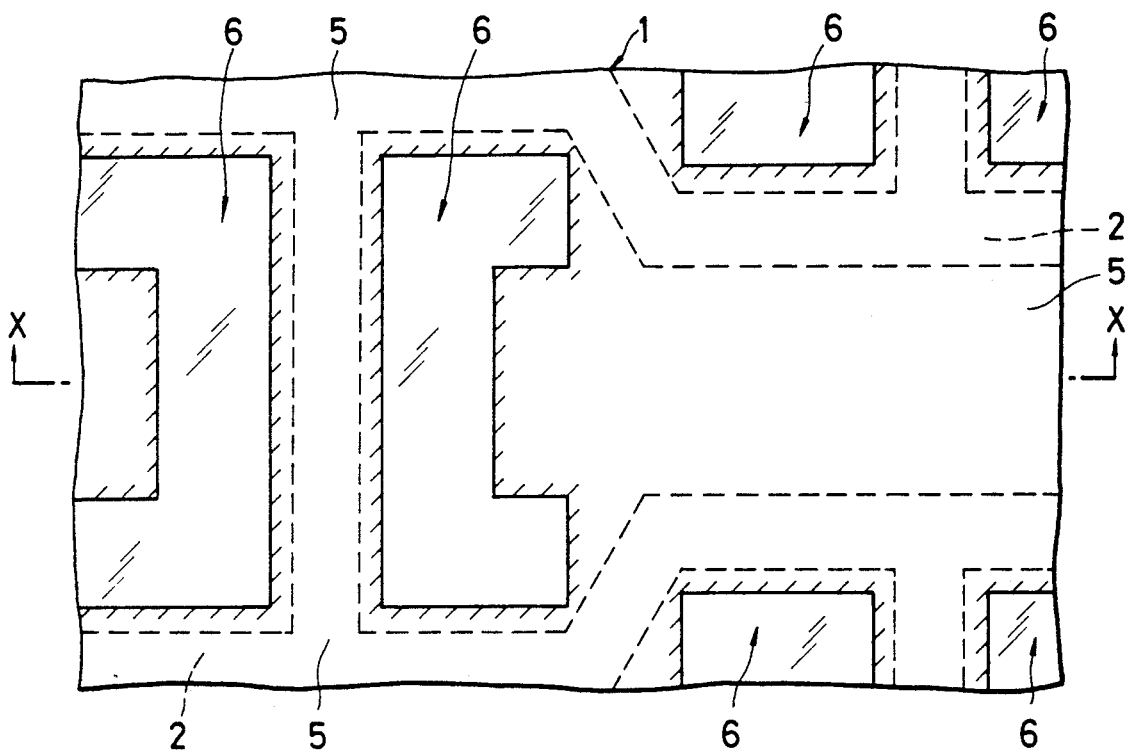
Figure 5B:
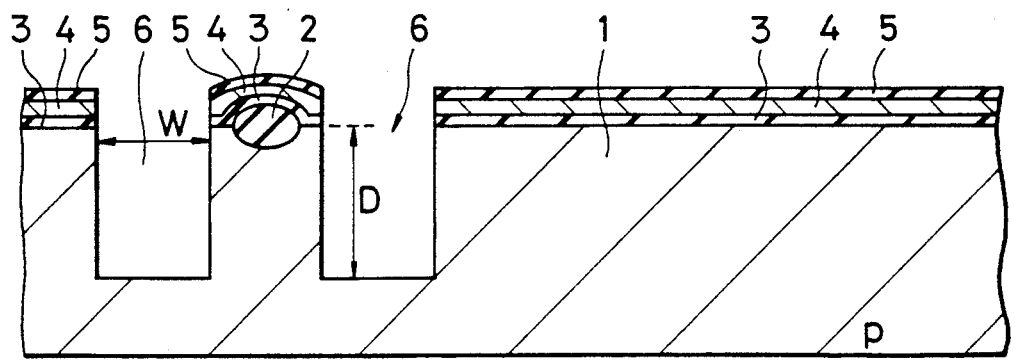

After the step illustrated in FIGS. 4A and 4B, an insulator film 3 is formed on the whole surface of the semiconductor substrate 1. As the insulator film 3, a silicon dioxide ($SiO_2$) film being 300 Å thick and formed by the thermal oxidation of the surface of the semiconductor substrate 1 is used by way of example. Thereafter, an insulator film 4 to serve as an oxidation impermeable mask is formed on the insulator film 3. As the insulator film 4, a silicon nitride (Si$_3$N$_4$) film being 500 Å thick and formed by the chemical vapor deposition (CVD) is used by way of example, Thereafter, an insulator film S which serves as a mask for dry etching for forming moats and which is thicker than the insulating film 3 is formed on insulator film 4. As the insulator film 5, a silicon dioxide film being 8000 Å and formed by the CVD is used by way of example. The insulator film 5 is patterned to form the mask for providing the moats 6 which constitute the capacitors of memory cells. Using this mask, the insulator films 4 and 3 are successively removed, and then, the semiconductor substrate 1 is removed, by the anisotropic dry etching such as reactive ion etching (RIE) with CCl$_4$-gas. Thus, the moats 6 are formed as shown in FIGS. 5A and 5B. The widthwise dimension W of the moat 6 is approximately 1–1.5 μm, while the depth D thereof from the surface of the semiconductor substrate 1 is approximately 3 μm. The ratio of the etching rates of silicon and silicon dioxide for the CCl$_4$-gas is 4:1. The depth D can be varied by varying the thickness of the insulator film 5.

After the steps illustrated in FIGS. 5A and 5B, the insulator film 5 having served as the mask for the dry etching is removed, and the insulator film 4 to serve as the mask for the thermal oxidation is exposed. Using the insulator film 4 as the mask, the surface of the semiconductor substrate 1 exposed in the moat 6 is thermally oxidized, thereby to form an SiO$_2$ film 7 of 4000–6000 Å sufficiently thicker than the insulator film 3 on the inside surface, i.e., the side surface and bottom surface of the moat 6. The SiO$_2$ film 7 electrically isolates the semiconductor substrate 1 and the first capacitor plate. This state is shown in FIGS. 6A and 6B.

Figure 6A:
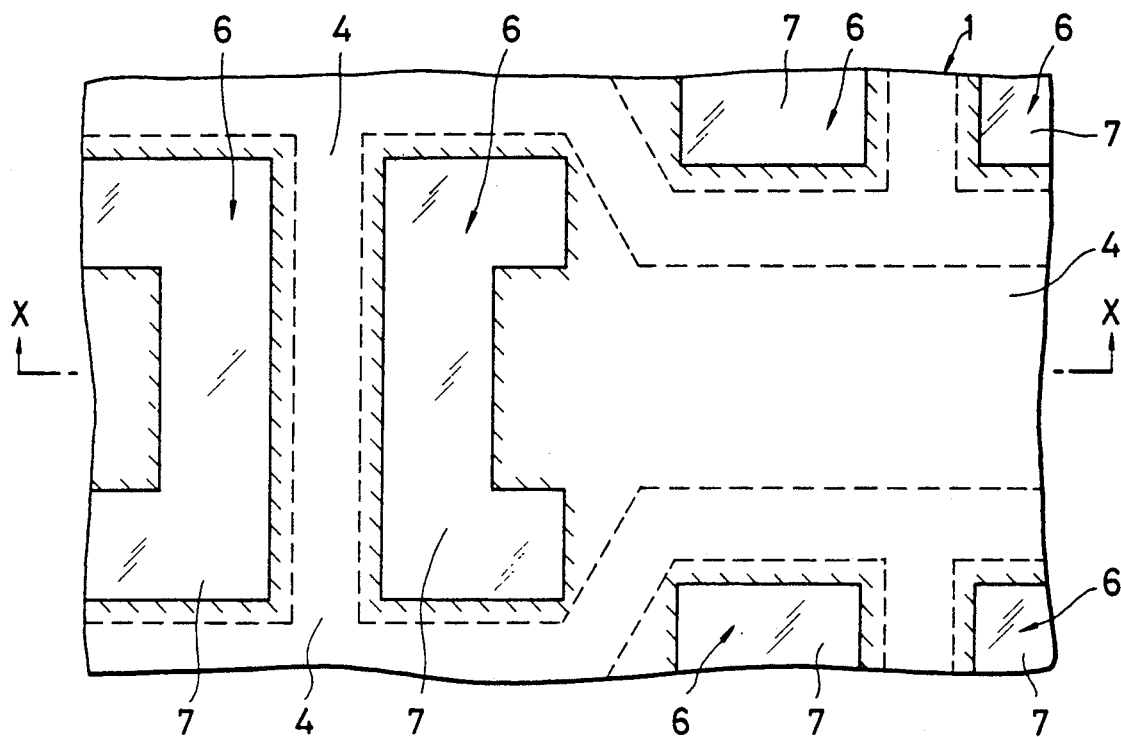
Figure 6B:
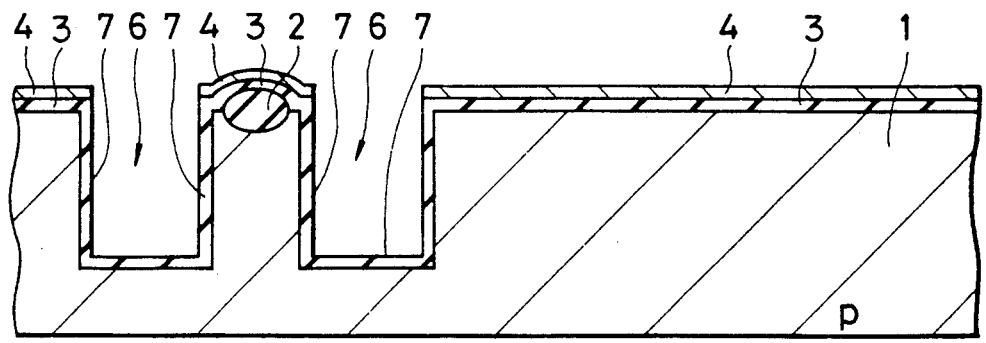
Figure 7A:
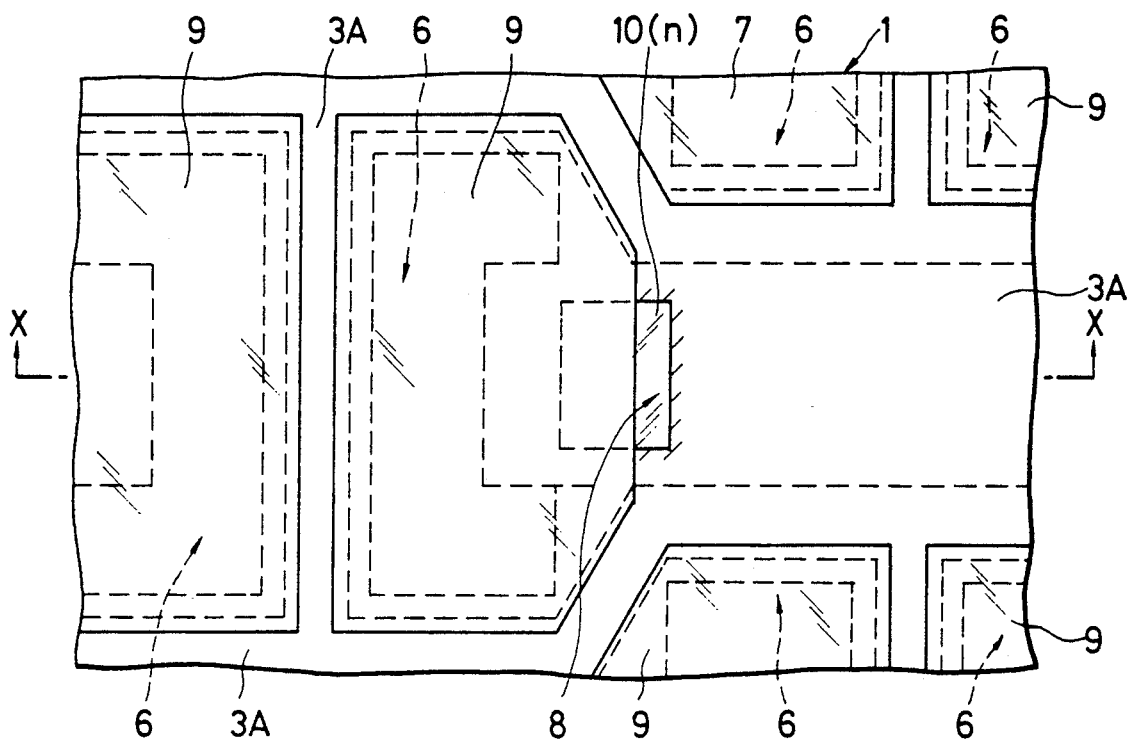
Figure 7B:
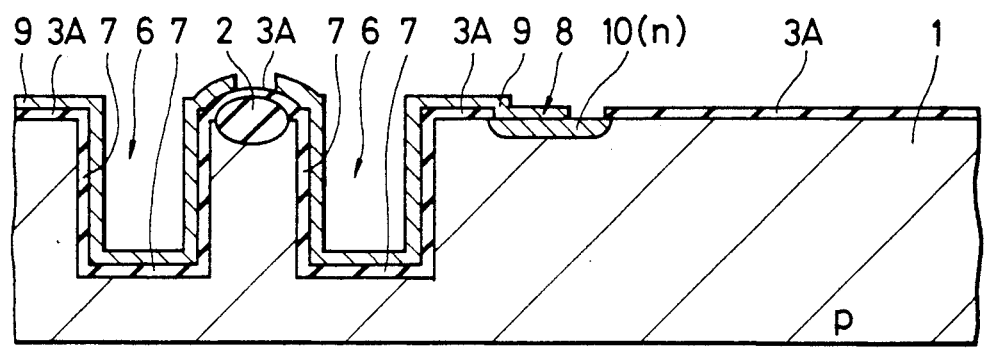

After the step illustrated in FIGS. 6A and 6B, the insulator films 4 and 3 are successively removed. The exposed surface of the semiconductor substrate 1 is thermally oxidized to form a new SiO$_2$ film 3A which is 300 Å thick. The predetermined part of the SiO$_2$ film 3A is removed to form a contact hole 8. This contact hole serves to connect the first capacitor plate and one semiconductor region to constitute a MISFET. Thereafter, polycrystalline silicon which is a conductive material is deposited on the whole area of the semiconductor substrate 1 to a thickness of 1000 Å, and phosphorus is introduced thereinto in order to establish a low resistivity. The polycrystalline silicon is patterned to form the first capacitor plate 9 constituting the capacitor of the memory cell as shown in FIGS. 7A and 7B. The thickness of the polycrystalline silicon film is approximately 500–1000 Å. An n-type semiconductor region 10 of 60 Ω/□ is formed by the diffusion of phosphorus into the semiconductor substrate 1 from the polycrystalline silicon within the contact hole 8.

Figure 8:
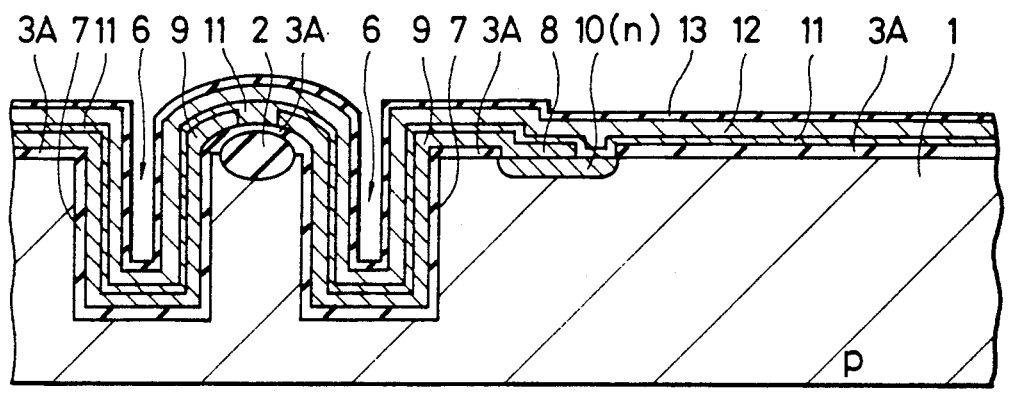

After the steps illustrated in FIGS. 7A and 7B, an insulator film (not shown) made of silicon dioxide and having a thickness of 60 Å by way of example is formed on the exposed surface of the first capacitor plate 9. This insulator film is formed by the thermal oxidation of the surface of the polycrystalline silicon film which makes the first capacitor plate 9. This insulator film serves to moderate a stress which develops due to the difference between the coefficients of thermal expansion of the first capacitor plate 9 and an insulator film 11 to be formed by a later step, and also to reduce the leakage current of the insulator film 11. Thereafter, the insulator film 11 for storing charges to serve as information is formed on the whole surface of the resultant semiconductor substrate 1 by the CVD. As the insulator film 11, a film of silicon nitride higher in the dielectric constant than silicon dioxide is used by way of example, and its thickness is approximately 150 Å. Thereafer, in order to reduce the leakage current of the insulator film 11, an insulator film (not shown) made of silicon dioxide and having a thickness of 20 Å is formed on the insulator film 11 by, e.g., the thermal oxidation of the insulator film 11. Subsequently, in order to form the second capacitor plate which constitutes the capacitor of the memory cell, polycrystalline silicon 12 is deposited on the whole surface of the resultant semiconductor substrate 1. Phosphorus is introduced into the polycrystalline silicon in order to lower the resistivity thereof. The thickness of the polycrystalline silicon film 12 is approximately 3500 Å. As shown in FIG. 8, an insulator film 13 is formed for the electrical isolation between the polycrystalline silicon 12 and a conductive material to be deposited thereon. This insulator film 13 is, for example, an SiO$_2$ film of 500 Å which is formed by the thermal oxidation of the surface of the polycrystalline silicon 12. The CVD may well be employed as the method of forming the insulator film 13.

Figure 9:
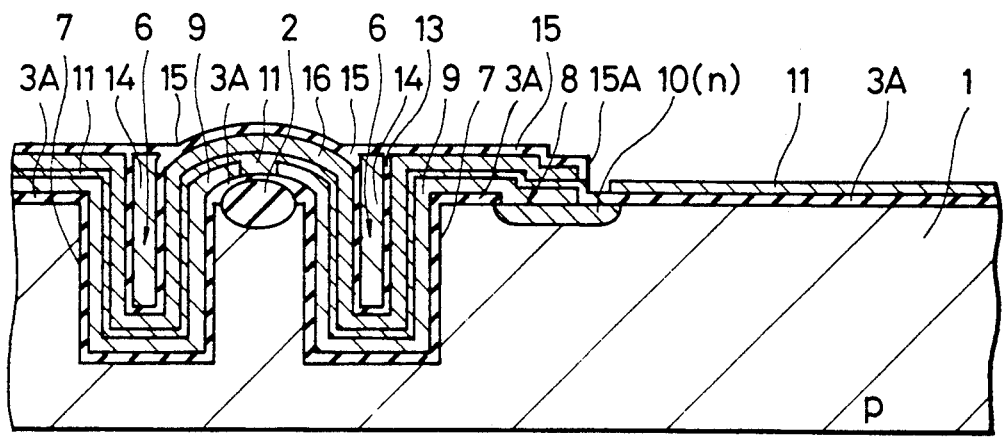

After the steps illustrated in FIG. 8, in order to fill up the moats 6, a filling material is deposited on the whole surface of the resultant semiconductor substrate 1 to a thickness of, e.g., 5000 Å. The filling material 14 other than parts buried in the moats 6 is removed. The surface of the filling material 14 and the exposed surface of the polycrystalline silicon 12 are made substantially even. Thus, depressions over the moats 6 are alleviated. The filling material 14 is, for example, polycrystalline silicon. The removal of the filling material 14 is executed by isotropic etching, for example, plasma etching. The insulator film 13 protects the polycrystalline silicon 12 during the removal of the filling material 14. It is effective that the polycrystalline silicon 12 and the filling material 14 are the same material. Thereafter, the surface of the filling material 14 is thermally oxidized. Simultaneously, the surface of the polycrystalline silicon 12 is further oxidized. An insulator film 15 (SiO$_2$ film) which is 2000 Å thick is formed by the thermal oxidation. The insulator film 15 and the polycrystalline silicon 12 in an area to form the MISFET are removed, and the second capacitor plate 16 to constitute the capacitor of the memory cell is formed. Thereafter, an insulator film (SiO$_2$ film) 15A is formed as shown in FIG. 9 in such a way that the exposed part of the polycrystalline silicon on the side surface of the second capacitor plate 16 is thermally oxidized using the insulator film 11 as a mask. The insulator film 11 is partly removed as shown in FIG. 9 before the insulator film 15A is formed. As a result, the insulator film 11 is divided into a part underlying the second capacitor plate 16 and a part overlying the area to form the MISFET. A high precision of registration is not necessary for this etching.

Figure 10A:
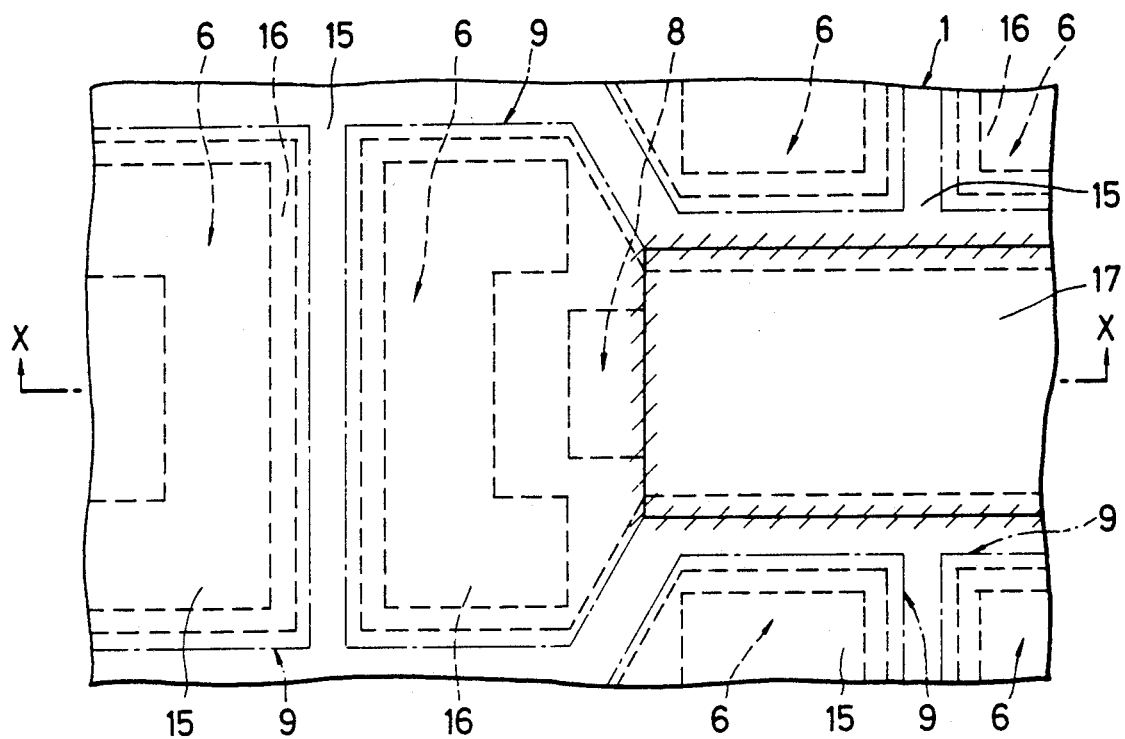
Figure 10B:
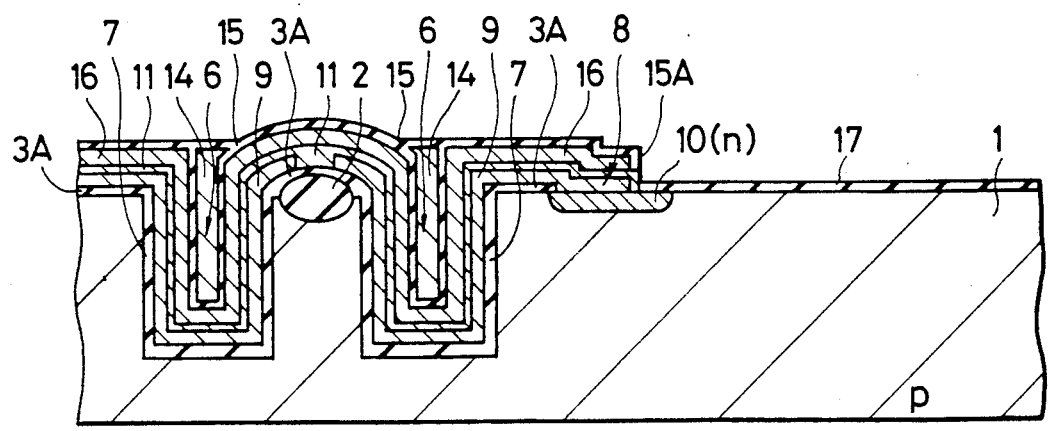

After the steps illustrated in FIG. 9, the insulator films 11 and 3 in the area to form the MISFET of the memory cell are removed. In the removed area, an insulator film 17 is formed as shown in FIGS. 10A and 10B to the end of forming a gate insulator film to constitute the MISFET. The insulator film 17 is formed by thermally oxidizing the surface of the semiconductor substrate 1 exposed by the removal of the insulator films 11 and 3. It is an SiO$_2$ film which is 300 Å thick.

After the steps illustrated in FIGS. 10A and 10B, a conductive material is deposited in order to form a gate electrode constituting the MISFET of the memory cell, as well as a word line. As the conductive material, there is employed polycrystalline silicon, a high-melting metal such as molybdenum (Mo) or tungsten (W), a silicide which is the compound between the high-melting metal and silicon, or a double-layer structure which consists of the polycrystalline silicon and the high-melting metal silicide overlying it. As regards thicknesses, a value of 3000-4000 Å is preferable for the polycrystalline silicon layer, and a high-melting metal silicide layer of 3000 Å and a polycrystalline silicon layer of 2000 Å are preferable for the double-layer structure consisting of the high-melting metal silicide ($WSi_2$) layer and the polycrystalline silicon layer. Tungsten silicide, molybdenum silicide, tantalum silicide and titanium silicide are preferred for use as the high-melting metal silicides. The conductive material is patterned to form the gate electrodes and word lines 18. Using the gate electrodes and word lines 18 as an impurity introducing mask, an $n^+$-type impurity is ion-implanted into the semiconductor substrate 1 of the area to form the MISFET of the memory cell. The impurity is diffused by the drive-in diffusion, to form $n^+$-type semiconductor regions 19. Thus, the MISFET Q is formed as shown in FIGS. 11A and 11B.

Figure 11A:
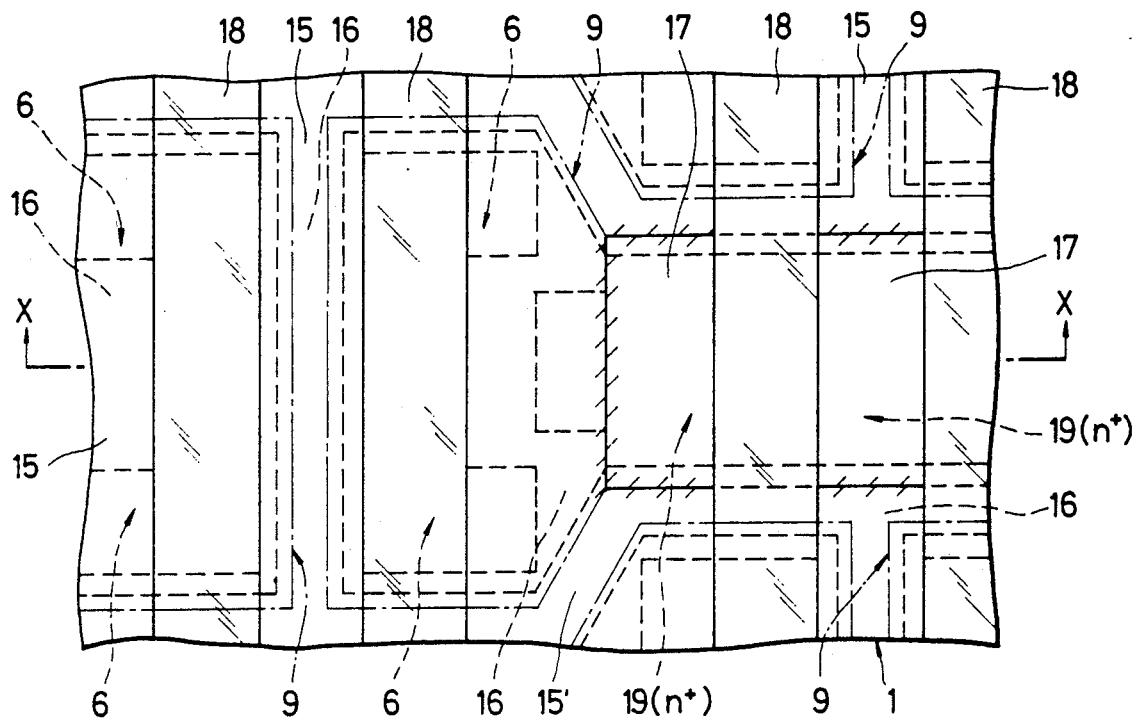
Figure 11B:
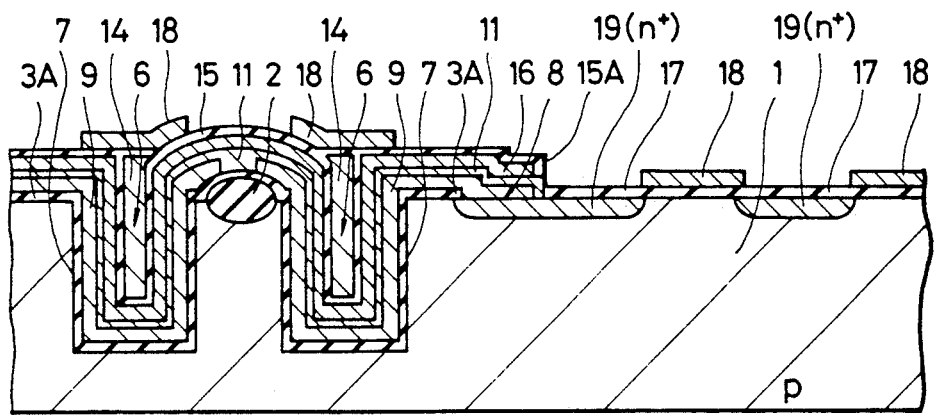
Figure 12A:
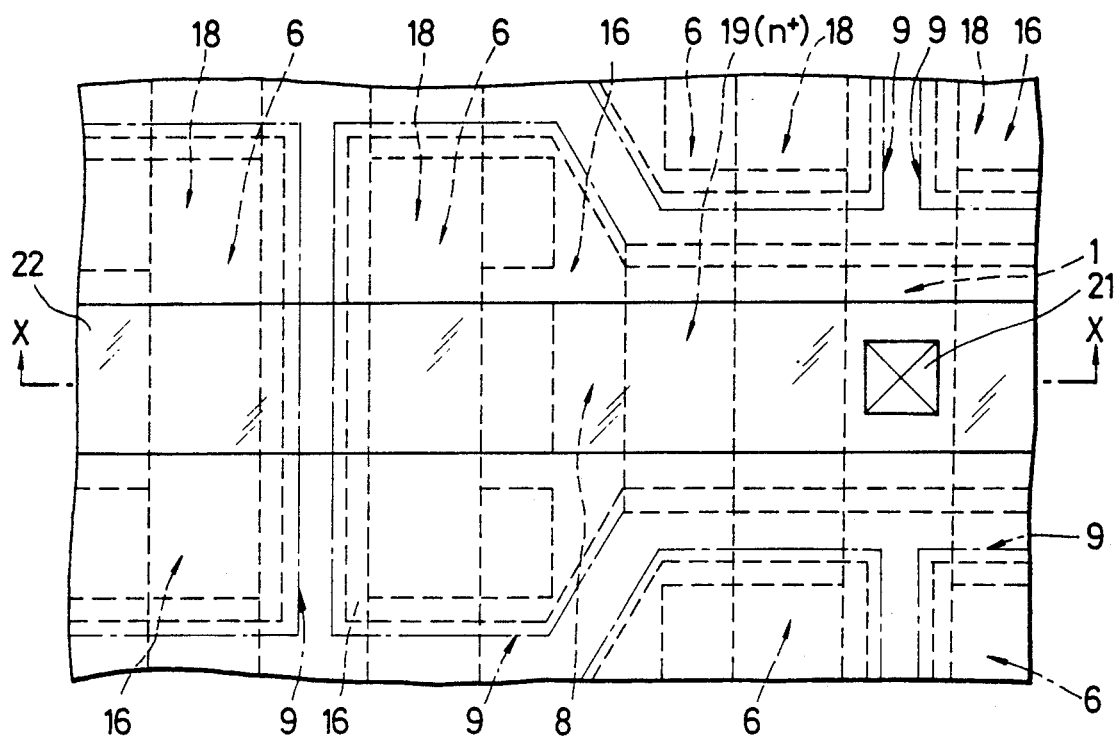
Figure 12B:
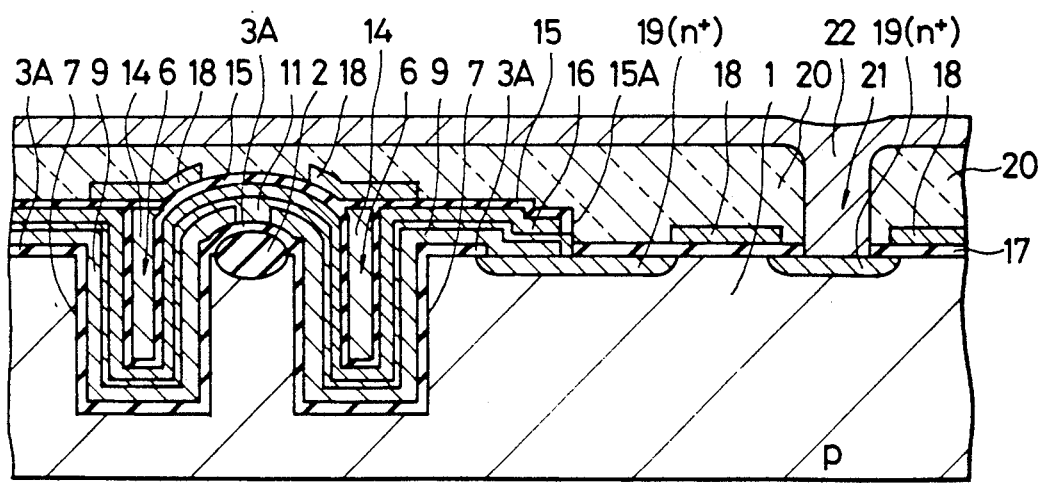

After the steps illustrated in FIGS. 11A and 11B, an insulator film 20 is formed on the whole surface of the resultant semiconductor substrate in order to electrically isolate the gate electrodes and word lines 18 and bit lines. Used as the insulator film 20 is, for example, a phosphosilicate glass (PSG) film which is 6000-8000 Å. The PSG film can alleviate the growth of undulations due to the multi-layering, and can capture sodium (Na) ions affecting the characteristics of a semiconductor integrated circuit device. The insulator films 20 and 17 on the other semiconductor region 19, which is remote with respect to the gate electrode 18 from one semiconductor region of the MISFET Q connected to the capacitor of the memory cell, are removed. Thus, a contact hole 21 for connecting the semiconductor region 19 and the bit line is formed. Thereafter, as shown in FIGS. 12A and 12B, the bit line 22 is formed so as to connect with the semiconductor region 19 through the contact hole 21. For example, an aluminum (Al) layer being 7000 Å thick is used as the bit line 22. Thereafter, a PSG film and a silicon nitride film formed by the plasma CVD overlying it are formed as a final passivation film.

The semiconductor integrated circuit device of the first embodiment of the present invention is completed by the aforementioned series of manufacturing steps.

Figure 13A:
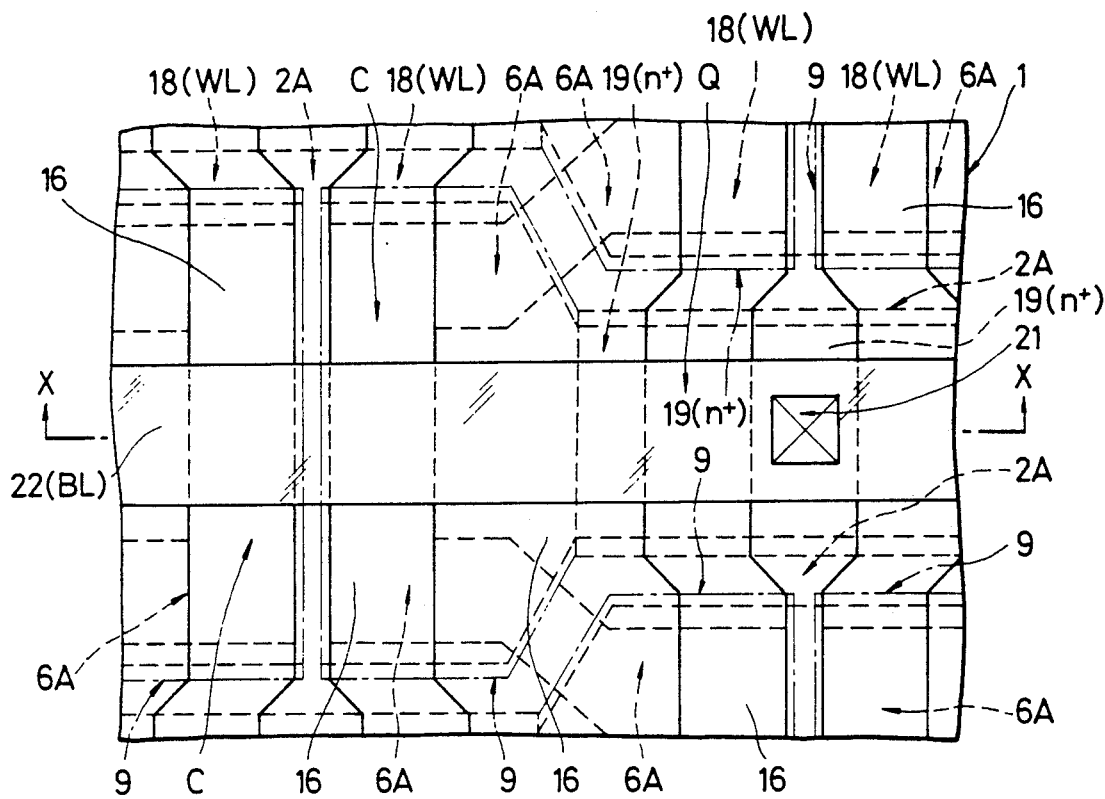
FIG. 13A is a plan view illustrative of the essential portions of a memory cell for explaining a DRAM of a second embodiment of the present invention.
Figure 13B:
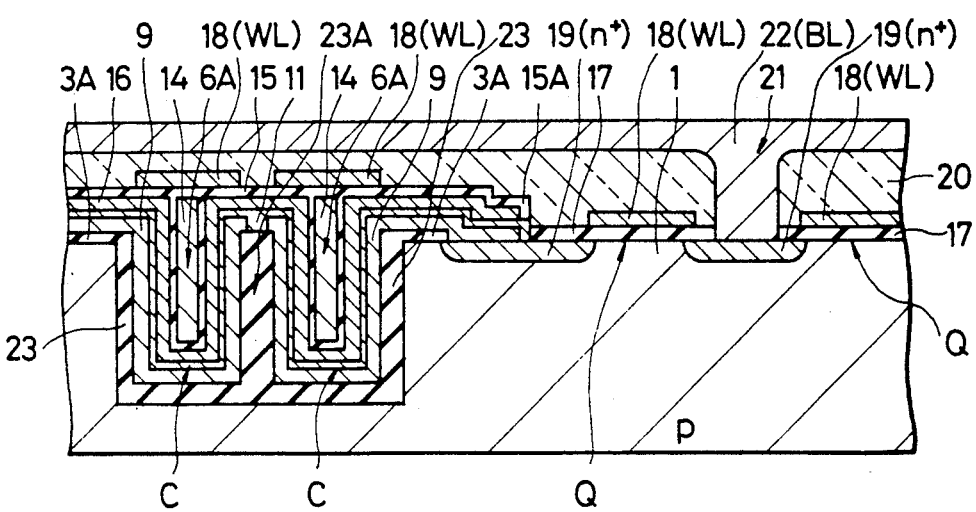
FIG. 13B is a sectional view taken along line X—X in FIG. 13A.

FIG. 13A is a plan view illustrative of the essential portions of a memory cell for explaining a DRAM of a second embodiment. FIG. 13B is a sectional view taken along line X—X in FIG. 13A. In the present embodiment, a different insulator film is used in place of the field insulator film of the first embodiment which lies between the two memory cells connected to the same bit line and having the capacitors adjacent to each other.

Throughout the figures concerning the second embodiment, portions having the same functions as in the first embodiment are assigned the same symbols, and they shall not be repeatedly explained. In FIG. 13A, gate electrodes and word lines 18(WL) are indicated by solid lines in order to clarify the illustration.

Referring to FIGS. 13A and 13B, numeral 23 designates an insulator film which is formed on the surface of the semiconductor substrate 1 within the moat 6A and which is thicker than the insulator film 3A. The insulator film 23 electrically isolates the semiconductor substrate 1 and the first capacitor plate 9. The insulator film 23A electrically isolates the capacitors of two memory cells which are connected to the same bit line (BL) 22 and whose capacitors are adjacent to each other. The insulator film 23A between the capacitors can be readily provided by a thermal oxidation from the inside surface of the moat 6A during the formation of the insulator film 23.

According to the second embodiment, the capacitors can be disposed within the moats which are electrically isolated from the semiconductor substrate.

In addition, a field insulator film having a bird's beak is not required for the isolation between the capacitors of the adjacent memory cells.

Figure 14A:
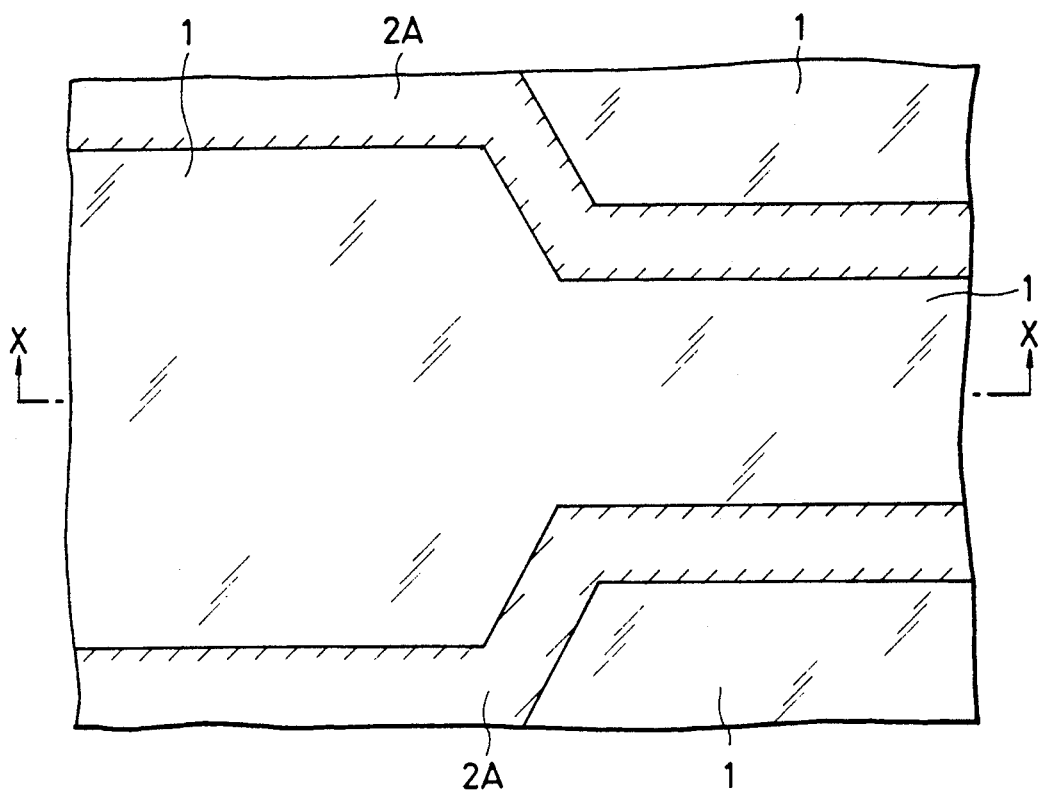
FIGS. 14A to 15B are views for explaining a method of manufacturing the DRAM in FIGS. 13A and 13B.
Figure 14B:
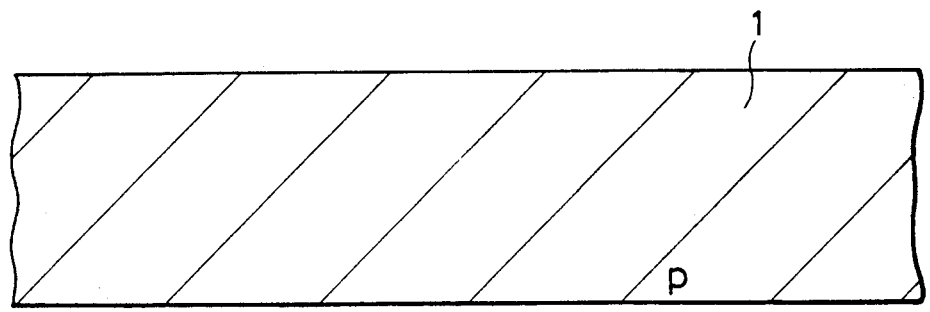
Figure 15A:
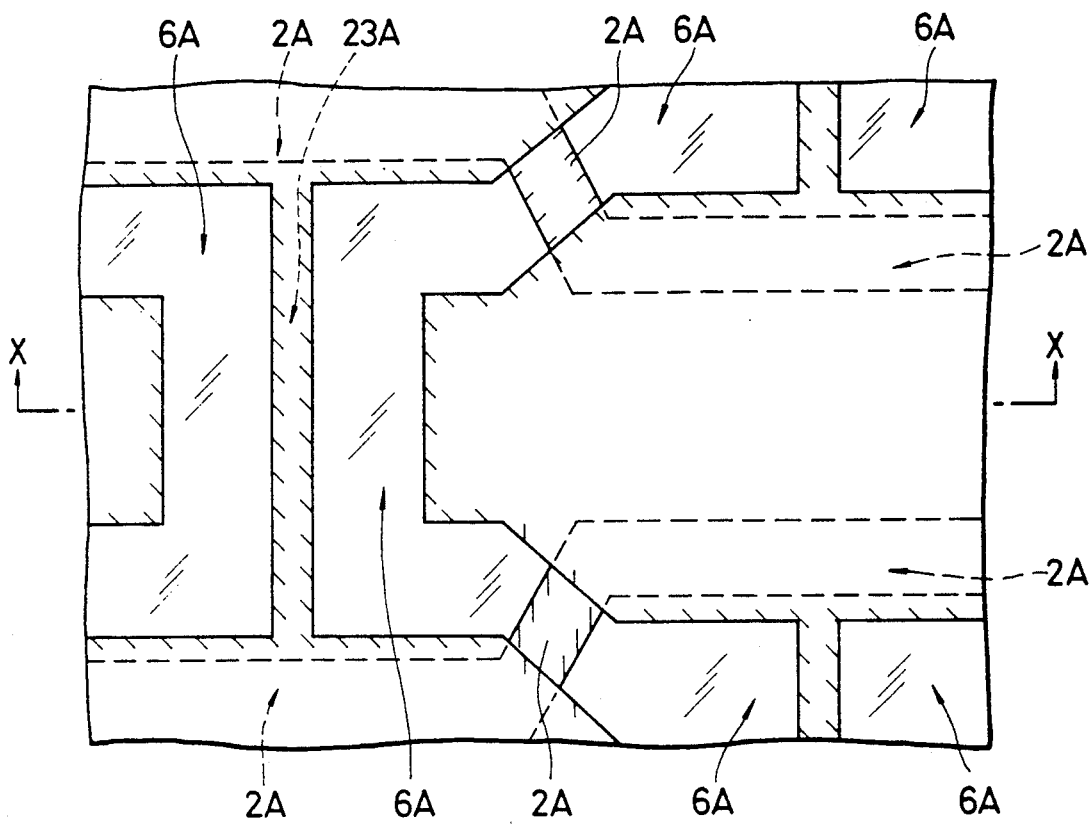
Figure 15B:
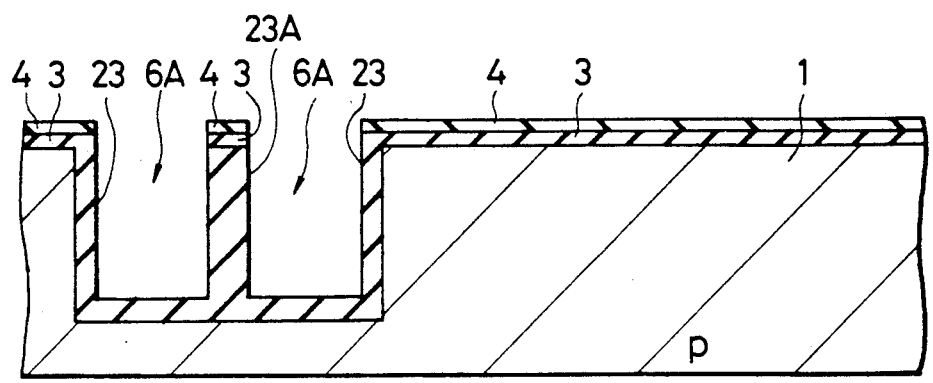

FIGS. 14A and 15A are plan views illustrative of the essential portions of a memory cell at manufacturing steps for explaining a method of producing the DRAM of the second embodiment. FIGS. 14B and 15B are sectional views illustrative of the essential portions of the memory cell at the manufacturing steps for explaining the method of producing the DRAM of the second embodiment. The sectional views labeled B are taken along lines X—X in the corresponding figures labeled A.

Likewise to the manufacturing method of the first embodiment, a p-type semiconductor substrate 1 is first prepared. A field insulator film is formed for electrically isolating semiconductor elements (not shown) which constitute the peripheral circuits of the memory cells of the semiconductor substrate 1, for example, an addressing circuit, a reading circuit and a writing circuit. This point is the same as in the first embodiment. In the memory cell of the semiconductor substrate 1, a field insulator film 2A is formed as shown in FIGS. 14A and 14B. The field insulator film 2A is formed as in the first embodiment except for the portion between the two memory cells which are connected to the same bit line and whose capacitors are adjacent to each other. The field insulator film 2A is formed by the well-known selective thermal oxidation of the semiconductor substrate 1. It is an $SiO_2$ film which is 0.6-1 μm thick.

After the step illustrated in FIGS. 14A and 14B, moats 6A are formed by the same method as in the first embodiment, employing the insulator films 3, 4 and 5. The width and depth of the moat 6A may be similar to those in the first embodiment. As seen from FIG. 15A, the shape of the insulator films 4 and 5 is such that the field insulator film 2A is partly exposed. A mask for forming the moats 6A is composed of the field insulator film 2A and the insulator film 5. The moats 6A can be formed in partial self-alignment with the field insulator film 2A. This leads to an increase in the capacitances of the capacitors. The distance between the respective moats 6A of the two memory cells connected to the same bit line and having the adjacent capacitors should preferably be small, for example, 1 μm.

Thereafter, the insulator film 5 is removed to expose the insulator film 4. Using the insulator film 4, the semiconductor substrate 1 exposed in the moats 6A is thermally oxidized. Thus, insulator films 23 and 23A made of an $SiO_2$ film are formed. The insulator film 23 extends along each moat 6A and is sufficiently thicker (4000-6000 Å) than the insulator film 3A so that it electrically isolates the semiconductor substrate 1 and the first capacitor plate. The insulator film 23A especially achieves the electrical isolation between the capacitors (moats 6A) of the two memory cells connected to the same bit line and having the adjacent capacitors. This insulator film 23A has heat-treatment conditions, etc. controlled in order that the semiconductor substrate 1 of the corresponding part between the moats 6A is completely turned into $SiO_2$ to form an $SiO_2$ barrier between the moats which is approximately 1 $\mu$m thick.

After the steps illustrated in FIGS. 15A and 15B, the steps of the manufacturing method of the first embodiment illustrated in FIGS. 5A and 5B, et seq. are similarly performed, whereby the semiconductor integrated circuit device of the present invention is finished up.

Figure 16A:
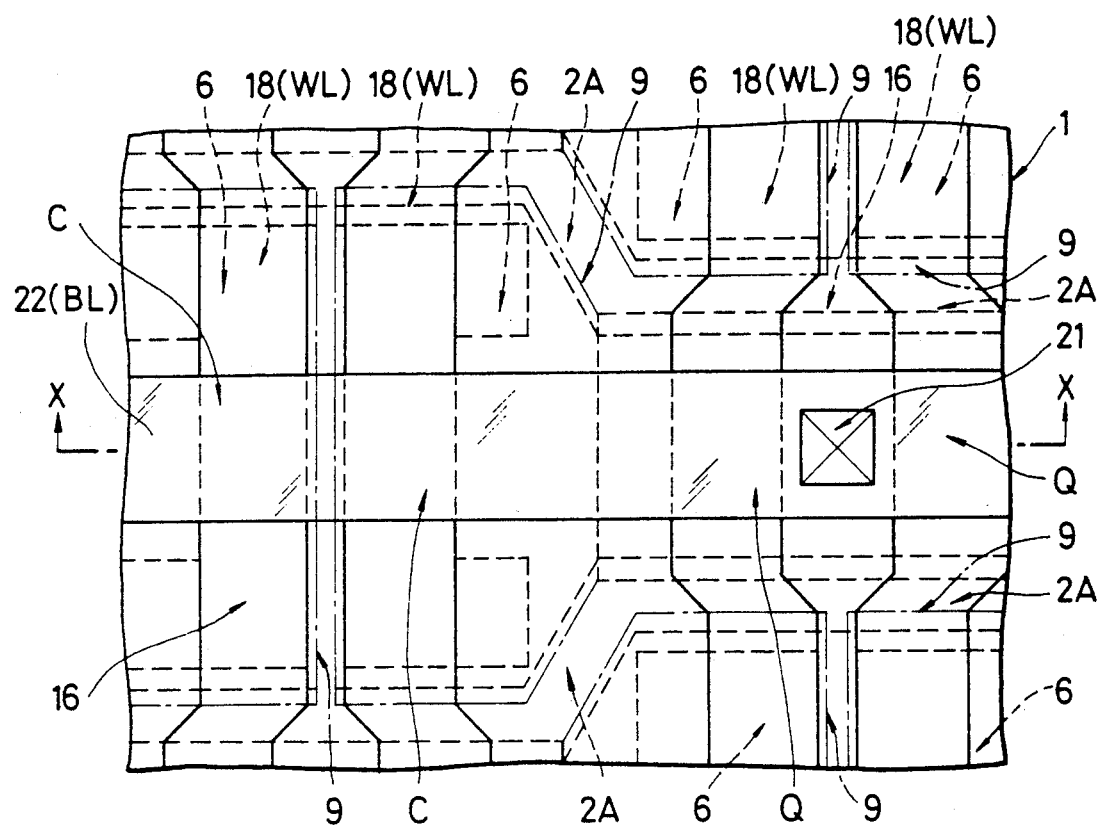
FIG. 16A is a plan view illustrative of the essential portions of a memory cell for explaining a DRAM of a third embodiment of the present invention.
Figure 16B:
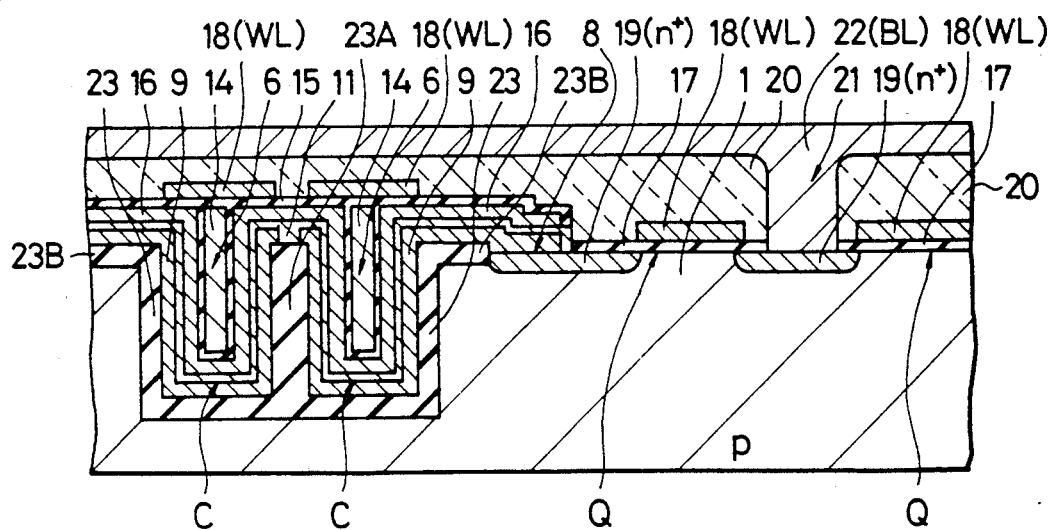
FIG. 16B is a sectional view taken along line X—X in FIG. 16A.

FIGS. 16A is a plan view illustrative of the essential portions of a memory cell for explaining a DRAM of a third embodiment, while FIG. 16B is a sectional view taken along line X—X in FIG. 16A.

In the third embodiment, the insulator film 3A of the second embodiment is replaced with a thicker insulator film 23B.

Throughout the figures concerning the third embodiment, parts having the same functions as in the first and second embodiments are assigned the same symbols, and they shall not be repeatedly explained. In FIGS. 16A, gate electrodes and word lines 18(WL) are indicated by solid lines for clear illustration.

Referring to FIGS. 16A and 16B, symbol 23B denotes an insulator film which is formed between the semiconductor substrate 1 and the first capacitor plate 9 outside the moat 6 so as to be sufficiently thicker (2000–6000 Å) than the insulator film 3A employed in the first and second embodiments to ensure isolation of the plate 9 from the substrate. The insulator film 23B electrically isolates the semiconductor substrate 1 and the first capacitor plate. Even when a voltage corresponding to information is applied to the first capacitor plate 9, charges to serve as the information are scarcely stored in the surface of the semiconductor substrate 1. No charge to serve as the information of the memory cell exists in the semiconductor substrate 1.

According to the third embodiment, the capacitor can be provided in only the moat which is electrically isolated from the semiconductor substrate. As will be stated below, the process of the third embodiment becomes more complicated than those of the first and second embodiments. Since, however, the insulator film 23B is thick, the capacitance between the first capacitor plate 9 and the semiconductor substrate 1 is quite negligible. Thus, the DRAM of the third embodiment is less liable to the influence of the potential fluctuation of the surface of the semiconductor substrate 1 by minority carriers created by $\alpha$ particles.

In addition, no field insulator film is required for the isolation of the capacitors of the adjacent memory cells.

Figure 17A:
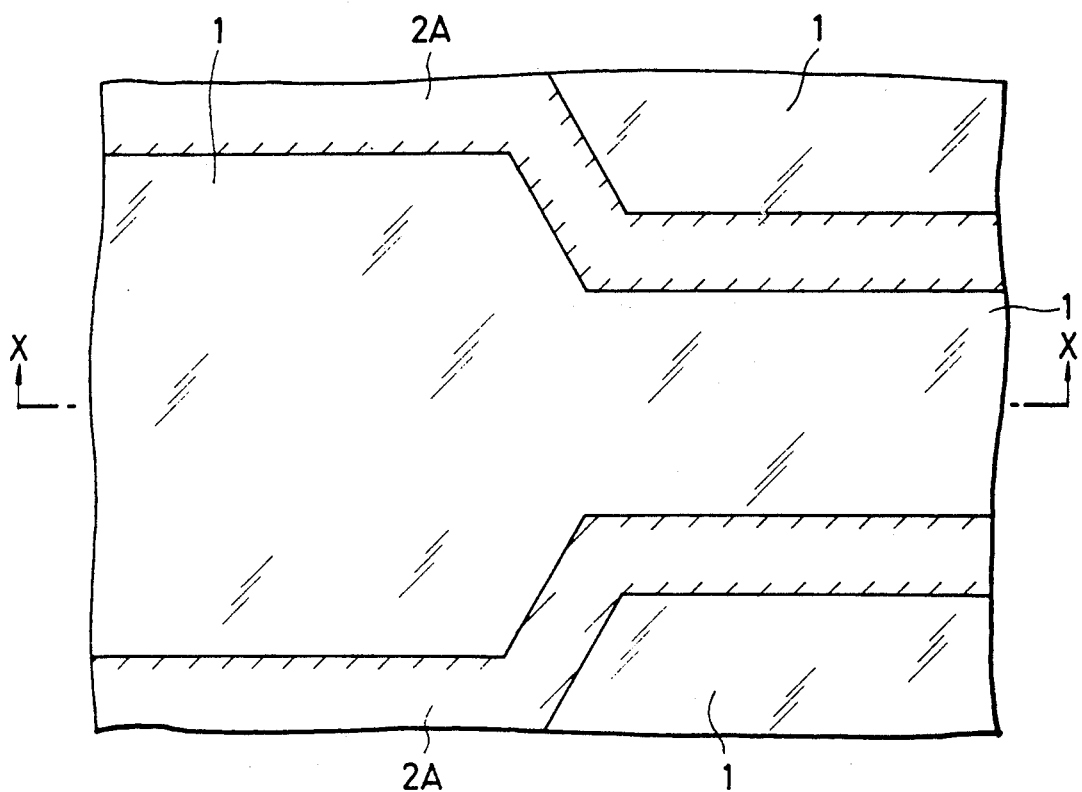
FIGS. 17A to 18B are views for explaInIng a method of manufacturing the DRAM shown in FIGS. 16A and 18B.
Figure 17B:
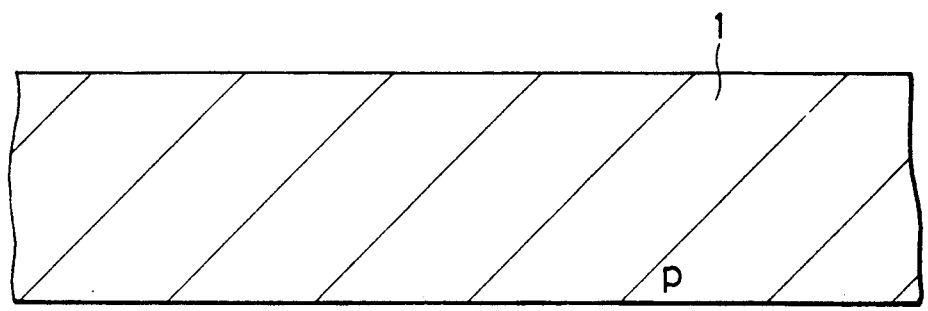
Figure 18A:
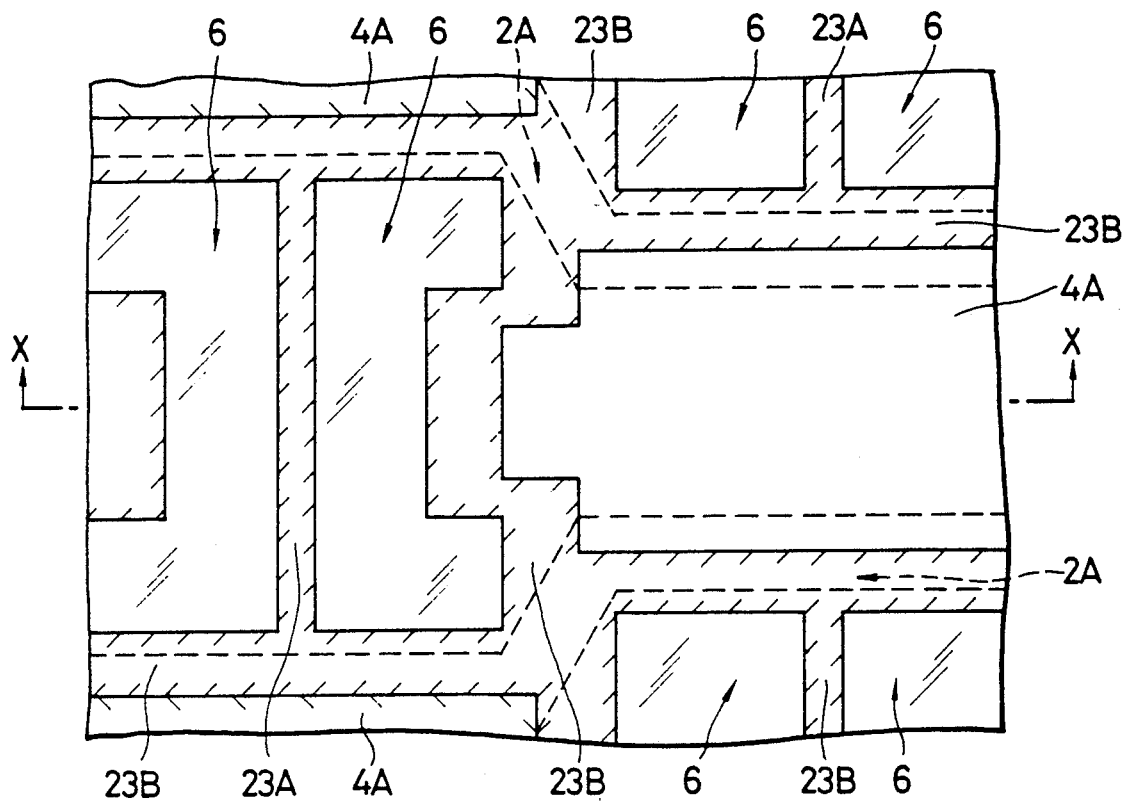
Figure 18B:
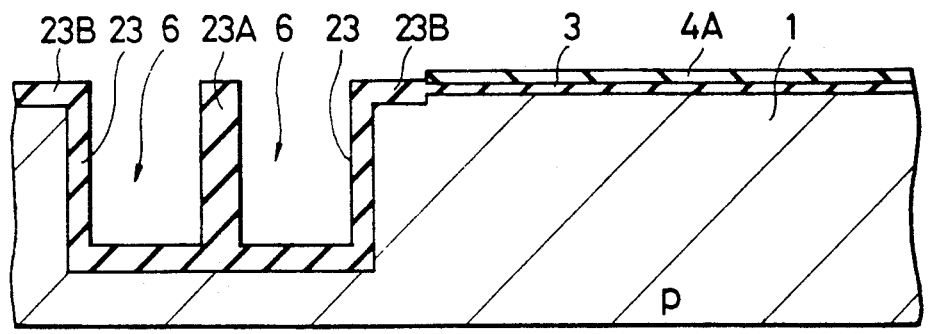

FIGS. 17A and 18A are plan views illustrative of the essential portions of a memory cell at manufacturing steps for explaining a method of producing the DRAM of the third embodiment. FIGS. 17B and 18B are sectional views illustrative of the essential portions of the memory cell at the manufacturing steps for explaining the method of producing the DRAM of the third embodiment of the present invention. The sectional views labelled B are taken along lines X—X in the corresponding figures labelled A.

As in the second embodiment, a p-type semiconductor substrate 1 is prepared. As shown in FIGS. 17A and 17B, an insulator film 2A similar to that of the second embodiment is formed on the semiconductor substrate 1.

After the step illustrated in FIGS. 17A and 17B, the step of the second embodiment shown in FIGS. 15A and 15B is performed to simultaneously form moats 6 and insulator films 23 and 23A as shown in FIGS. 18A and 18B. The insulator films 23 and 23A have equal thicknesses (4000–6000 Å), with 23A actually going completely through the portion of the substrate 1 between the moats to form an $SiO_2$ barrier between the moats which is 8000–12000 Å thick. Thereafter, an insulator film 4 is removed, and an insulator film 4A to serve as a mask for thermal oxidation is formed by the CVD process on parts other than the portions of the moats 6 and the semiconductor substrate 1 on which the first capacitor plates are formed. For example, a silicon nitride film 500 Å thick is used as the insulator film 4A. Using the insulator film 4A, the semiconductor substrate 1 is thermally oxidized to form insulator films 23B for electrically isolating the semiconductor substrate 1 and the first capacitor plates as shown in FIGS. 18A and 18B.

After the steps illustrated in FIGS. 18A and 18B, the steps of the manufacturing method of the first embodiment shown in FIGS. 5A and 5B, et seq. are similarly performed, whereby the semiconductor integrated circuit device of the present embodiment is finished up.

The insulator film 4 can be used instead of the insulator film 4A without being removed. In this case, after the formation of the moats 6, the insulator film 4 is selectively etched and removed to provide a mask having the same shape as that of the insulator film 4A.

According to the present invention, the capacitor is provided within the moat which is electrically isolated from the semiconductor substrate. Thus, depletion layers which extend into the semiconductor substrate from the respective capacitors of the adjacent memory cells can be removed. Accordingly, the phenomenon of leakage to the respective capacitors of the adjacent memory cells is prevented. Moreover, minority carriers to be created within the semiconductor substrate by $\alpha$ particles can be prevented from effecting charges to serve as information. Further, the capacitor of high capacitance can be formed to occupy only a small area.

Since the capacitor is formed on the insulator film, not in the semiconductor substrate, no leakage current is involved between the capacitor and the substrate, and the information retention time can be remarkably prolonged.

Since the capacitors of the adjacent memory cells in a predetermined direction can be electrically isolated without using the field insulator film, the density of integration in a memory array portion can be enhanced.

Even when the moat has a widthwise dimension above approximately, 1 $\mu$m, it is filled up with the first capacitor plate, the second capacitor plate and the filling material. The upper part of the moat is flattened, and the working dispersions of the word line and the bit line to be formed over the moat can be reduced.

In the above, the invention made by the inventor has been concretely described in conjunction with the embodiments. Needless to say, however, the present invention is not restricted to the foregoing embodiments, but it can be variously modified within a scope not departing from the subject matter thereof.

As the filling material 14, it is also possible to employ silicon dioxide instead of the polycrystalline silicon.

Figure 19:
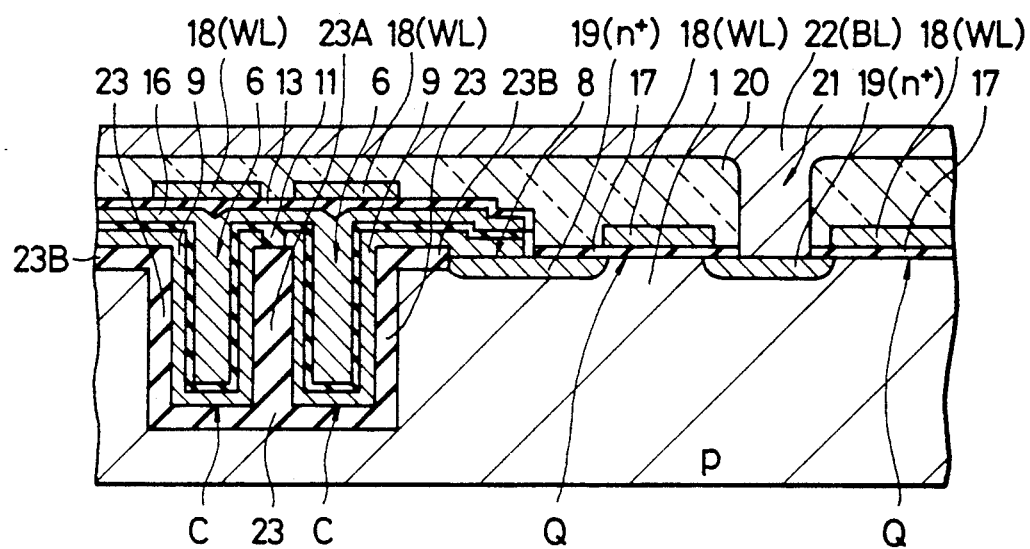
FIG. 19 is a sectional view showing still another embodiment of the present invention.

As shown in FIG. 19, the polycrystalline silicon of the second capacitor plate 16 may well be used for filling up the moat 6 so as to flatten the surface thereof, without employing any filling material 14. In this case, the insulator film 13 is formed to be thick. This measure dispenses with the steps of depositing and etching the filling material 14 and the step of forming the insulator film 15. FIG. 19 shows a modification of the third embodiment. Regarding the first and second embodiments, the polycrystalline silicon of the second capacitor plate 16 may be quite similarly buried in the moat 6 so as to flatten the surface thereof without using the filling material 14.

As the insulator film 11 of the capacitor, a silicon dioxide ($SiO_2$) film can also be employed.

While all the embodiments have pertained to DRAMs of the folded bit type, the present invention is also applicable to DRAMS of the open bit line type.

The conductivity types of the semiconductor substrate and the semiconductor regions may well be the opposite to those shown in the foregoing description for each embodiment. The memory cells may well be provided within semiconductor regions (wells) which are formed in the semiconductor substrate and which have the conductivity type opposite to that of the semiconductor substrate.

I claim:

1. A dynamic random access memory device comprising:
   a semiconductor substrate which has a major surface;
   memory cells each of which is comprised of a MISFET and a capacitor connected in series with said MISFET, said MISFET comprising a gate electrode, a gate insulator film, and source and drain regions, said capacitor comprising a first conductor layer, a first insulator film formed on said first conductor layer and a second conductor layer formed on said first insulator layer, one of said first or second conductor layers being connected to one of said source or drain regions and being disposed independently for each said capacitor of each said memory cell;
   moats which are formed at said major surface of said semiconductor substrate by partly removing said semiconductor substrate, which are provided in correspondence with said capacitors and each of which has its side surface covered with a second insulator film,
   wherein each said capacitor is provided on a surface of said second insulator film in said moat with said first conductor film being formed over said second insulator film, wherein said second insulator film has a thickness larger than a thickness of said gate insulator film so that said capacitor is isolated from said substrate by said second insulator film, and further wherein said first and second conductor layers of said capacitor are formed of polycrystalline silicon film by a deposition process so that said first conductor layer is formed over said second insulator film in said moat, said first insulator film is formed over said first conductor layer in said moat, and said second conductor layer is formed over said first insulator film in said moat;
   word lines which extend in one direction over said semiconductor substrate, and each of which is connected with the gate electrodes of the MISFETs;
   data lines which extend in a direction intersecting said word lines over said semiconductor substrate, and each of which is connected with the others of the source or drain regions of the MISFETs which source or drain regions are not connected to said one of said first or second conductor layers of a capacitor, said memory cells being provided in correspondence with respective data lines; and
   a third insulator film which isolates the adjacent memory cells, and which surrounds at least an area where said capacitor is formed, wherein the thickness of said third insulator film is larger than that of said second insulator film.

2. A semiconductor memory device according to claim 1, wherein said second insulator film is a silicon dioxide film.

3. A semiconductor memory device according to claim 2, wherein an upper surface of said second conductor layer of said capacitor is substantially flat.

4. A semiconductor memory device according to claim 1, wherein said first insulator film and said second conductor layer are arranged to be common to the capacitors of a plurality of memory cells.

5. A semiconductor memory device according to claim 1,
   wherein said third insulator film surrounds an area where said MISFET is formed, except the source or drain region of said MISFET connected to said data line.

6. A semiconductor memory device according to claim 5, wherein said third insulator film is a silicon dioxide film.

7. A semiconductor memory device according to claim 6, wherein said third insulator film isolates two adjacent moats corresponding to said capacitors of said memory cells connected to an identical bit line.

8. A semiconductor memory device according to claim 6, wherein at least a part of said moat is defined by said third insulator film.

9. A semiconductor memory device according to claim 7, wherein said third insulator film is formed integrally with said second insulator film.

10. A dynamic random access memory device comprising:
    a monocrystalline semiconductor silicon body which has a major surface;
    memory cells each of which is comprised of a MISFET and a capacitor connected in series with said MISFET, said MISFET comprising a gate electrode, a gate insulator film, and source and drain regions, said capacitor comprising a first conductor layer, a first insulator film formed on said first conductor layer and a second conductor layer formed on said first insulator layer, one of said first or second conductor layers being connected to one of said source or drain regions and being disposed independently for each said capacitor of each said memory cell;
    moats which are formed at said major surface of said semiconductor body, which are provided in correspondence with said capacitors each of which has its side surface covered with a second insulator film,
    wherein each said capacitor is provided on a surface of said second insulator film in said moat with said first conductor film being formed over said second insulator film, wherein said second insulator film has a thickness larger than a thickness of said gate insulator film so that said capacitor is isolated from said semiconductor body by said second insulator film, and further wherein said first and second conductor layers of said capacitor are formed of polycrystalline silicon film by a deposition process so that said first conductor layer is formed over said second insulator film in said moat, said first insulator film is formed over said first conductor layer in said moat, and said second conductor layer is formed over said first insulator film in said moat;

word lines which extend in one direction over said major surface of said semiconductor body, and each of which is connected with the gage electrodes of the MISFETs;

data lines which extend in a direction intersecting said word lines over said major surface of said semiconductor body, and each of which is connected with the others of the source or drain regions of the MISFETs which others of said source or drain regions are not connected to said one of said first or second conductor layers of a capacitor, said memory cells being provided in correspondence with respective data lines; and a third insulator film which isolates the adjacent memory cells, and which surrounds at least an area where said capacitor is formed, wherein the thickness of said third insulator film is larger than that of said second insulator film.

11. A semiconductor memory device according to claim 10, wherein said third insulator film is a silicon dioxide film.

12. A semiconductor memory device according to claim 11, wherein said third insulator film isolates two adjacent moats corresponding to said capacitors of said memory cells connected to an identical bit line.

13. A semiconductor memory device according to claim 11, wherein at least a part of said moat is defined by said third insulator film.

14. A semiconductor memory device according to claim 13, wherein said third insulator film is formed by a selective thermal oxidation for said major surface of said semiconductor body.

15. A dynamic random access memory device according to claim 1, wherein said third insulator film is about twice as thick as said second insulator film.

16. A dynamic random access memory device according to claim 10, wherein said third insulator film is about twice as thick as said second insulator film.

* * * * *